US008907882B2

(12) United States Patent
Miyamoto et al.

(10) Patent No.: US 8,907,882 B2
(45) Date of Patent: Dec. 9, 2014

(54) GATE SIGNAL LINE DRIVE CIRCUIT AND DISPLAY DEVICE

(75) Inventors: Motoharu Miyamoto, Mobara (JP); Takahiro Ochiai, Chiba (JP)

(73) Assignee: Japan Display Inc., Tokyo (JP)

( * ) Notice: Subject to any disclaimer, the term of this patent is extended or adjusted under 35 U.S.C. 154(b) by 234 days.

(21) Appl. No.: 13/460,890

(22) Filed: May 1, 2012

(65) Prior Publication Data

US 2012/0280967 A1    Nov. 8, 2012

(30) Foreign Application Priority Data

May 2, 2011 (JP) .................................. 2011-103164

(51) Int. Cl.
*G09G 3/36* (2006.01)
*G11C 19/28* (2006.01)

(52) U.S. Cl.
CPC ........ *G11C 19/28* (2013.01); *G09G 2310/0286* (2013.01); *G09G 2300/0434* (2013.01); *G09G 3/3677* (2013.01)
USPC ............................................. 345/94; 345/87

(58) Field of Classification Search
USPC ................. 345/87–104
See application file for complete search history.

(56) References Cited

U.S. PATENT DOCUMENTS

| | | | | |
|---|---|---|---|---|
| 5,867,138 A | * | 2/1999 | Moon | 345/92 |
| 6,845,140 B2 | * | 1/2005 | Moon et al. | 377/78 |
| 2005/0156856 A1 | * | 7/2005 | Jang et al. | 345/100 |
| 2007/0070020 A1 | | 3/2007 | Edo et al. | |
| 2008/0258998 A1 | | 10/2008 | Miyake | |
| 2010/0302217 A1 | * | 12/2010 | Ochiai et al. | 345/204 |
| 2011/0007061 A1 | * | 1/2011 | Ochiai et al. | 345/212 |
| 2011/0193622 A1 | | 8/2011 | Miyake | |

FOREIGN PATENT DOCUMENTS

| | | |
|---|---|---|
| JP | 2007-95190 | 4/2007 |
| JP | 2008-122939 | 5/2008 |

* cited by examiner

*Primary Examiner* — Kevin M Nguyen
*Assistant Examiner* — Cory Almeida
(74) *Attorney, Agent, or Firm* — Antonelli, Terry, Stout & Kraus, LLP.

(57) ABSTRACT

Provided is a gate signal line drive circuit including a shift register basic circuit for applying a high voltage for a signal high period and a low voltage for a signal low period to a gate signal line at the time of a screen display. The shift register basic circuit includes a gate line high voltage applying circuit applying a high voltage for the signal high period to the gate signal line, and a gate line low voltage applying circuit applying a low voltage to the gate signal line, wherein in the shift register basic circuit, the off-voltage is applied to the switch of the gate line low voltage applying circuit for a predetermined period at the time of a screen non-display.

18 Claims, 12 Drawing Sheets

GATE SIGNAL LINE DRIVE CIRCUIT AND DISPLAY DEVICE

CROSS-REFERENCE TO RELATED APPLICATION

The present application claims priority from Japanese application JP 2011-103164, filed on May 2, 2011, the content of which is hereby incorporated by reference into this application.

BACKGROUND OF THE INVENTION

1. Field of the Invention

The present invention relates to a gate signal line drive circuit and a display device using the same, and more particularly, to noise suppression in the gate signal line drive circuit.

2. Description of the Related Art

In the related art, for example, in regard to a liquid crystal display device, there is disclosed a method in which a shift register circuit provided for a gate signal line drive circuit that scans a gate signal line is formed on the same substrate as thin film transistors (hereinafter, referred to as TFTs) that are disposed in a display region of a display screen, that is, a shift register-embedded method is adopted. As the shift register circuit according to the related art, shift register circuits disclosed in JP 2007-95190 A and JP 2008-122939 A are exemplified.

In each of a plurality of shift register basic circuits that are provided for the gate signal line drive circuit, at the time of a normal screen display, a high voltage is applied to a gate signal line as a gate signal $G_n$ only for a gate scanning period (hereinafter, referred to as a signal high period), which corresponds to the gate signal line that is connected to the shift register basic circuit, in one frame period, and a low voltage is applied to the gate signal line as the gate signal $G_n$ for a period (hereinafter, referred to as a signal low period) other than the gate scanning period.

FIG. 11 shows a simplified schematic diagram illustrating a configuration of the shift register basic circuit according to the related art. The shift register basic circuit is provided with a gate line low voltage applying circuit SWA that applies a low voltage to the gate signal line in response to the signal low period, and a gate line high voltage applying circuit SWG that applies a high voltage to the gate signal line in response to the signal high period.

A clock signal $V_n$ of a predetermined cycle is input to an input side of the gate line high voltage applying circuit SWG. The gate line high voltage applying circuit SWG is turned on in response to the signal high period and a voltage of the clock signal $V_n$ is applied to the gate signal line in order for a high voltage to be applied to the gate signal line for a signal high period. Here, the clock signal $V_n$ is a clock signal that is set to a high voltage in the predetermined cycle and is set to the high voltage for the signal high period. In addition, the gate line high voltage applying circuit SWG is turned off in response to the signal low period and blocks a voltage of the clock signal $V_n$, and therefore the voltage of the clock signal $V_n$ is not applied to the gate signal line. A voltage, which is applied to a switch of the gate line high voltage applying circuit SWG, is set at a node N1. The node N1 is set to an on-voltage while the gate line high voltage applying circuit SWG is in on-state, and therefore the on-voltage is applied to the switch of the gate line high voltage applying circuit SWG. In addition, the node N1 is set at an off-voltage while the gate line high voltage applying circuit SWG is in off-state, and therefore the off-voltage is applied to the switch of the gate line high voltage applying circuit SWG.

A low voltage line $V_{GL}$, which is set to a low voltage, is connected to the input side of the gate line low voltage applying circuit SWA. The gate line low voltage applying circuit SWA is turned on in response to the signal low period and the low voltage of the low voltage line $V_{GL}$ is applied to the gate signal line in order for the low voltage to be stably applied to the gate signal line for the signal low period. In addition, the gate line low voltage applying circuit SWA is turned off in response to the signal high period. A voltage, which is applied to a switch of the gate line low voltage applying circuit SWA is set as a node N2. The node N2 is set to an on-voltage while the gate line low voltage applying circuit SWA is in on-state, and therefore the on-voltage is applied to the switch of the gate line low voltage applying circuit SWA. In addition, the node N2 is set to an off-voltage while the gate line low voltage applying circuit SWA is in off-state, and therefore the off-voltage is applied to the switch of the gate line low voltage applying circuit SWA.

FIG. 12 shows a circuit diagram of the shift register basic circuit according to the related art. Each of the transistors shown in FIG. 12 is an NMOS transistor, an on-voltage of each of the transistors is set to a high voltage, and an off-voltage is set to a low voltage. As shown in FIG. 12, a transistor T5 and a voltage-raising capacitor C1 correspond to the gate line high voltage applying circuit SWG. The node N1 is set to a high voltage in response to the signal high period, and a voltage of the clock signal $V_n$, which is input from an input terminal IN1, is applied to a gate signal line that is connected to an output terminal OUT and is output as a gate signal $G_n$.

In addition, as shown in FIG. 12, a transistor T6 corresponds to the gate line low voltage applying circuit SWA. The node N2 is held at a high voltage in response to the signal low period, and a low voltage of the low voltage line $V_{GL}$ is applied to the gate signal line that is connected to the output terminal OUT and the low voltage is output as the gate signal $G_n$.

SUMMARY OF THE INVENTION

At the time of a normal screen display, the signal low period occupies an almost period in one frame period, so that the gate line low voltage applying circuit SWA is held at on-state over a long time. At this time, the high voltage is applied to the switch of the gate line low voltage applying circuit SWA over a long time. In general, when an on-voltage (as a DC voltage) is applied to a switch of a switching element over a long time, a threshold voltage $V_{TH}$ of the switching element is shifted to a positive side, and properties of the switching element deteriorate. When a threshold voltage $V_{TH}$ of the gate line low voltage applying circuit SWA is shifted to the positive side, the gate line low voltage applying circuit SWA may not stably apply the low voltage of the low voltage line $V_{GL}$ to the gate signal line connected to the output terminal OUT in response to the signal low period. As a result, a noise occurs in the gate signal $G_n$ and properties deteriorate.

The invention has been made in consideration of these circumstances, and an object of the invention is to provide a gate signal line drive circuit in which a deterioration in properties of a switching element to which an on-voltage is applied over a long time is suppressed and thereby a decrease in performance as a gate signal line drive circuit is suppressed, and a display device using the gate signal line drive circuit.

(1) According to an aspect of the invention, there is provided a gate signal line drive circuit including a shift register basic circuit, which applies a high voltage for a signal high period and a low voltage for a signal low period that is a period other than the signal high period, to a gate signal line at the time of a screen display. The shift register basic circuit includes a gate line high voltage applying circuit to which a clock voltage line is connected on an input side thereof. A clock signal of a predetermined cycle set to a high voltage for the signal high period at the time of a screen display is input to the clock voltage line. An on-voltage is applied to a switch of the gate line high voltage applying circuit in response to the signal high period and an off-voltage is applied to the switch thereof in response to the signal low period. The gate line high voltage applying circuit applies a voltage of the clock signal line to the gate signal line in on-state. The shift register basic circuit further includes a gate line low voltage applying circuit in which a first reference voltage line that is set to a low voltage at the time of the screen display is connected on an input side thereof. An on-voltage is applied to a switch of the gate line low voltage applying circuit in response to the signal low period and an off-voltage is applied to the switch thereof in response to the signal high period. The gate line low voltage applying circuit applies a voltage of the first reference voltage line to the gate signal line in on-state. In the shift register basic circuit, the off-voltage is applied to the switch of the gate line low voltage applying circuit for a predetermined period at the time of a screen non-display.

(2) In the gate signal line drive circuit according to (1), the first reference voltage line may be set to a high voltage for the predetermined period at the time of the screen non-display.

(3) In the gate signal line drive circuit according to (1) or (2), the shift register basic circuit may further include a high voltage application off-control circuit in which a second reference voltage line that is set to an off-voltage at the time of the screen display is connected on an input side thereof. An on-voltage is applied to a switch of the high voltage application off-control circuit in response to the signal low period and an off-voltage is applied to the switch thereof in response to the signal high period. The high voltage application off-control circuit applies a voltage of the second reference voltage line to the switch of the gate line high voltage applying circuit in on-state. In the shift register basic circuit, the off-voltage may be applied to the switch of the high voltage application off-control circuit for the predetermined period at the time of the screen non-display.

(4) In the gate signal line drive circuit according to (3), the second reference voltage line may be set to the on-voltage for the predetermined period at the time of the screen non-display.

(5) In the gate signal line drive circuit according to (3) or (4), the second reference voltage line may be connected to the first reference voltage line, the off-voltage of the second reference voltage line may be the same as the low voltage of the first reference voltage line, and the on-voltage of the second reference voltage line may be the same as the high voltage of the first reference voltage line.

(6) In the gate signal line drive circuit according to any one of (1) to (5), the shift register basic circuit may further include a screen non-display period gate line high voltage applying circuit, which enters on-state for the predetermined period at the time of the screen non-display, and which applies the high voltage to the gate signal line.

(7) In the gate signal line drive circuit according to (1) or (2), the shift register basic circuit may further include a low voltage application on-control circuit including an on-application switching element. The on-application switching element is connected to another clock voltage line to which a clock signal of the predetermined cycle with a phase different from that of the clock signal at the time of the screen display is input on an input side thereof. The on-application switching element enters on-state when the clock signal of the different phase is at a high voltage, and applies a voltage of the clock signal of the different phase to the output side. The shift register basic circuit may further include a screen non-display period off-control switching element that is provided between an output side of the on-application switching element and the switch of the gate line low voltage applying circuit The screen non-display period off-control switching element enters on-state at the time of the screen display and thereby is electrically connected, and enters off-state for the predetermined period at the time of the screen non-display and thereby is electrically insulated. The on-voltage, which is applied to the switch of the gate line low voltage applying circuit, may be the same as the high voltage of the clock signal with the different phase.

(8) In the gate signal line drive circuit according to any one of (3) to (5), the shift register basic circuit may further include a low voltage application on-control circuit including an on-application switching element. The on-application switching element is connected to another clock voltage line to which a clock signal of the predetermined cycle with a phase different from that of the clock signal at the time of the screen display is input on an input side thereof. The on-application switching element enters on-state when the clock signal of the different phase is at a high voltage, and applies a voltage of the clock signal of the different phase to the output side. The shift register basic circuit may further include a screen non-display period off-control switching element that is provided between an output side of the on-application switching element and both of the switch of the gate line low voltage applying circuit and the switch of the high voltage application off-control circuit. The screen non-display period off-control switching element enters on-state at the time of the screen display and thereby is electrically connected, and enters off-state for the predetermined period at the time of the screen non-display and thereby is electrically insulated. The switch of the gate line low voltage applying circuit and the switch of the high voltage application off-control circuit may be electrically connected to each other, and the on-voltage that is applied to the switch of the gate line low voltage applying circuit and the on-voltage that is applied to the switch of the high voltage application off-control circuit may be the same as the high voltage of the clock signal with the different phase.

(9) In the gate signal line drive circuit according to (7), the shift register basic circuit may further include a screen non-display period switch off-voltage applying circuit, which enters on-state for the predetermined period at the time of the screen non-display, and which applies the off-voltage to the switch of the gate line low voltage applying circuit.

(10) In the gate signal line drive circuit according to (8), the shift register basic circuit may further include a screen non-display period switch off-voltage applying circuit, which enters on-state for the predetermined period at the time of the screen non-display, and which applies the off-voltage to the switch of the gate line low voltage applying circuit and the switch of the high voltage application off-control circuit.

(11) In the gate signal line drive circuit according to (9) or (10), the other clock voltage line may be held at a high voltage for the predetermined period at the time of the screen non-display.

(12) The gate signal line drive circuit according to any one of (3) to (5) may further include another shift register basic circuit that applies to another gate signal line a high voltage for another signal high period at the time of the screen display, applies a low voltage for another signal low period that is a period other than the other signal high period at the time of the screen display, and applies a high voltage for the predetermined period at the time of the screen non-display. The shift register basic circuit may further include a screen non-display period high voltage application on-control circuit. A switch of the screen non-display period high voltage application on-control circuit is connected to the other gate signal line. The screen non-display period high voltage application on-control circuit enters on-state when the high voltage is applied to the other gate signal line, and applies an on-voltage to the switch of the gate line high voltage applying circuit for the predetermined period at the time of the screen non-display.

(13) In the gate signal line drive circuit according to (12), the clock voltage line may be held at a high voltage for the predetermined period at the time of the screen non-display.

(14) According to another aspect of the invention, there is provided a display device including the gate signal line drive circuit according to (6) or (13), and a pixel circuit that is connected to the gate signal line, wherein the pixel circuit includes a pixel switching element that enters on-state by the high voltage of the gate signal line, and supplies a voltage of a video signal line to an output side thereof. The video signal line is connected to an input side of the pixel switching element.

(15) The display device according to (14) may further include a light source on a side opposite to a display side of the pixel circuit. The predetermined period at the time of the screen non-display may be included in a period in which the light source is not turned on during activation.

(16) According to further another aspect of the invention, there is provided a display device including the gate signal line drive circuit according to any one of (1) to (13).

According to the aspects of the invention, there are provided a gate signal line drive circuit in which a deterioration in properties of a switching element to which an on-voltage is applied over a long period of time is suppressed and thereby a decrease in performance as a gate signal line drive circuit is suppressed, and a display device using the gate signal line drive circuit.

DETAILED DESCRIPTION OF THE INVENTION

First Embodiment

Figure 1:
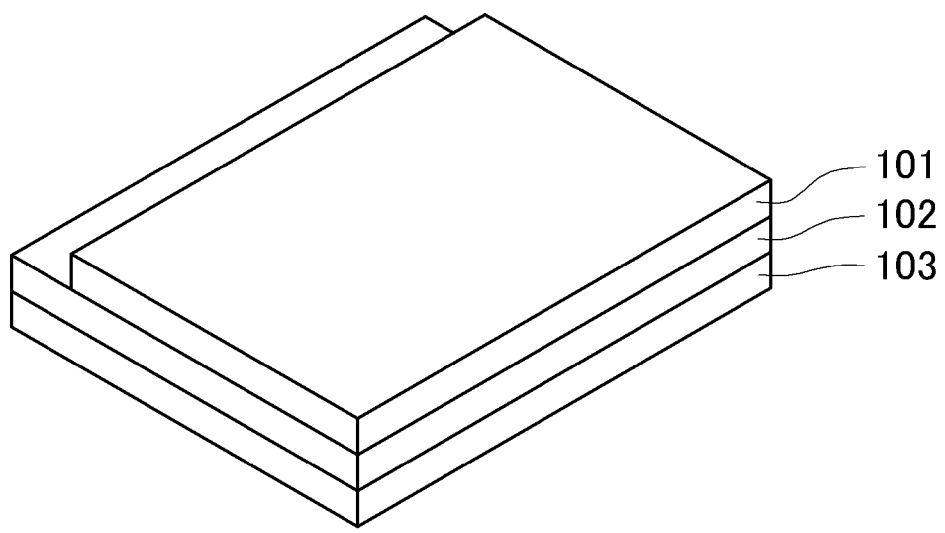
FIG. 1 is an overall perspective view of a liquid crystal display device according to a first embodiment of the invention.

A display device according to a first embodiment of the invention is, for example, an IPS (In-Plane Switching) type liquid crystal display device. FIG. 1 shows an overall perspective view illustrating a liquid crystal display device according to this embodiment of the invention. The liquid crystal display device includes a TFT substrate 102, a filter substrate 101 in which a color filter is provided to be opposite to the TFT substrate 102, a liquid crystal material that is sealed in a region interposed between both of the substrates, and a backlight 103 that comes into contact with the TFT substrate 102 on a side opposite to the filter substrate 101. In addition, as described later, in the TFT substrate 102, gate signal lines 105, video signal lines 107, pixel electrodes 110, common electrodes 111, TFTs 109, and the like are disposed (refer to FIG. 2).

Figure 2:
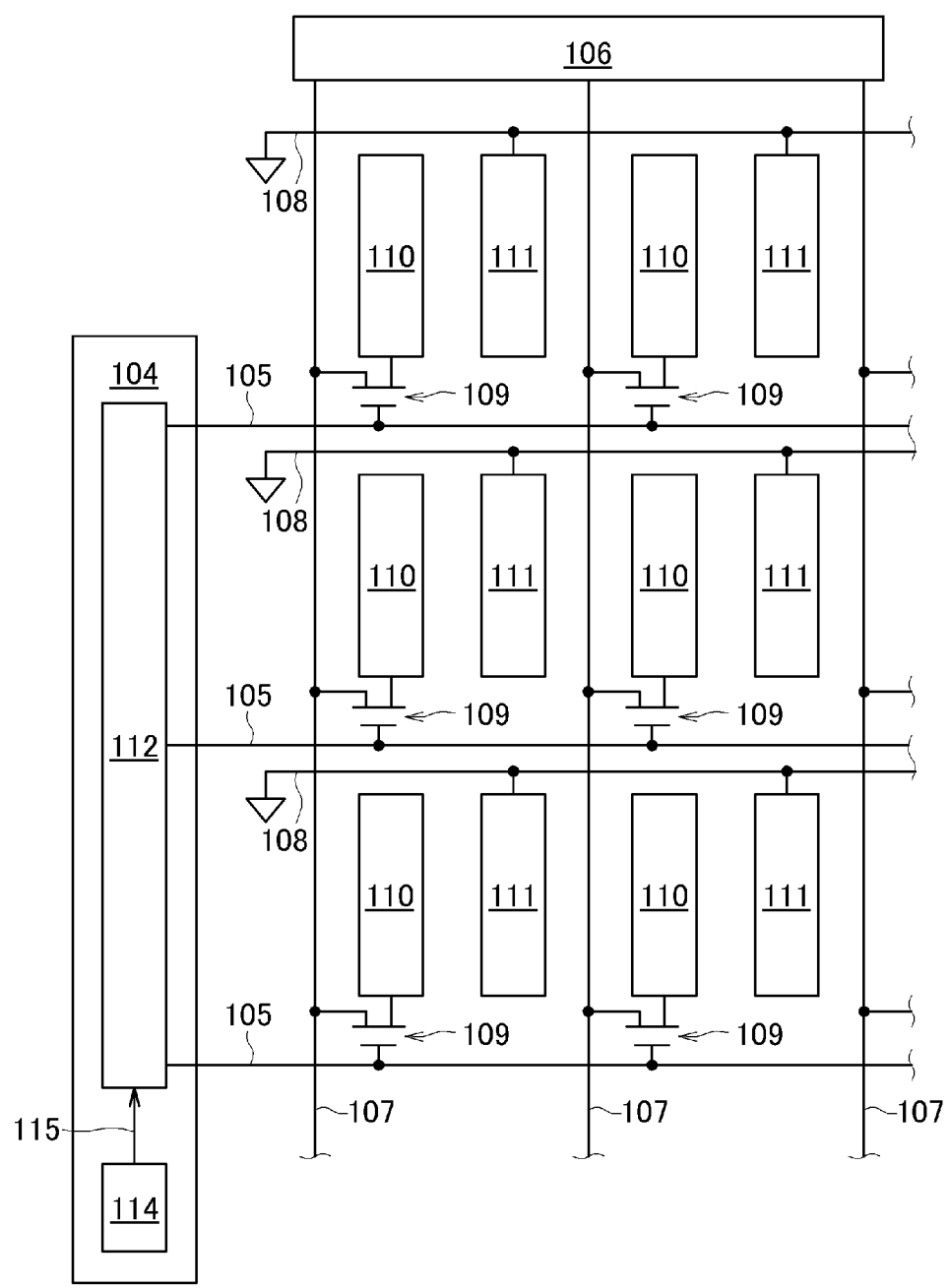
FIG. 2 is a conceptual diagram of an equivalent circuit of a TFT substrate according to the first embodiment of the invention.

FIG. 2 shows a conceptual diagram illustrating an equivalent circuit of the TFT substrate 102. In FIG. 2, in the TFT substrate 102, a plurality of gate signal lines 105, which are connected to a gate signal line drive circuit 104, extend in a horizontal direction in the drawing equally spaced from each other.

The gate signal line drive circuit 104 is provided with a shift register control circuit 114 and a shift register circuit 112, and the shift register control circuit 114 outputs control signals 115, as described later, to the shift register circuit 112.

The shift register circuit 112 is provided with a plurality of shift register basic circuits 113 (not shown) described later corresponding to the plurality of gate signal lines 105, respectively. For example, when 800 gate signal lines 105 are present, similarly, 800 shift register basic circuits 113 are provided for the shift register circuit 112. At the time of a normal screen display, each of the shift register basic circuits 113 applies a high voltage for a corresponding gate scanning period (signal high period) and a low voltage for a period (signal low period) other than the gate scanning period in one frame period to the corresponding gate signal line 105 by the control signal 115 input from the shift register control circuit 114.

In addition, a plurality of video signal lines 107, which are connected to a data drive circuit 106, extend in a vertical direction in the drawing equally spaced from each other. In addition, a plurality of pixel regions that are arranged in a grid shape are partitioned by the gate signal lines 105 and the video signal lines 107, respectively, and thereby a pixel circuit is formed in each pixel region. In addition, each of the common signal lines 108 extends in a horizontal direction in the drawing in parallel to each of the gate signal lines 105.

In a corner of each of the pixel circuits, each of the TFTs 109 is formed and is connected to each of the video signal lines 107 and each of the pixel electrodes 110. In addition, a gate of the TFT 109 is connected to the gate signal line 105.

Each of the common electrodes 111 is formed in each of the pixel circuits to be opposite to the pixel electrode 110.

In addition, the shift register control circuit 114 and the data drive circuit 106 are shown as a separate circuit in FIG. 2, but the shift register control circuit 114 and the data drive circuit 106 may be a controller driver IC that is integrated in one chip.

In the above-described circuit configuration, a reference voltage is applied to the common electrode 111 of each pixel circuit through each of the common signal lines 108. In addition, when a gate voltage that is set to the high voltage is selectively applied to the gate of the TFT 109 by the gate signal line 105, the current that flows through the TFT 109 is controlled. Through the TFT 109 in which the gate voltage set to the high voltage is applied to a gate thereof, a voltage of a video signal supplied to the video signal line 107 is selectively applied to the pixel electrode 110. Due to this, a potential difference occurs between the pixel electrode 110 and the common electrode 111, and thereby an alignment of liquid crystal molecular is controlled. Therefore, a degree of shielding light from the backlight 103 is controlled and thereby an image is displayed.

In FIG. 2, for a simple explanation, the shift register circuit 112 is shown only in the left side in FIG. 2, but actually, the shift register basic circuits 113 of the shift register circuit 112 are disposed at both of left and right sides of a display region. For example, when it is assumed that 800 gate signal lines 105 are present, due to a plurality of shift register basic circuits 113 that are disposed at both sides, respectively, for example, right-side shift register basic circuits 113 output a gate signal to odd-numbered gate signal lines 105 and left-side shift register basic circuits 113 output the gate signal to even-numbered gate signal lines 105.

Figure 3:
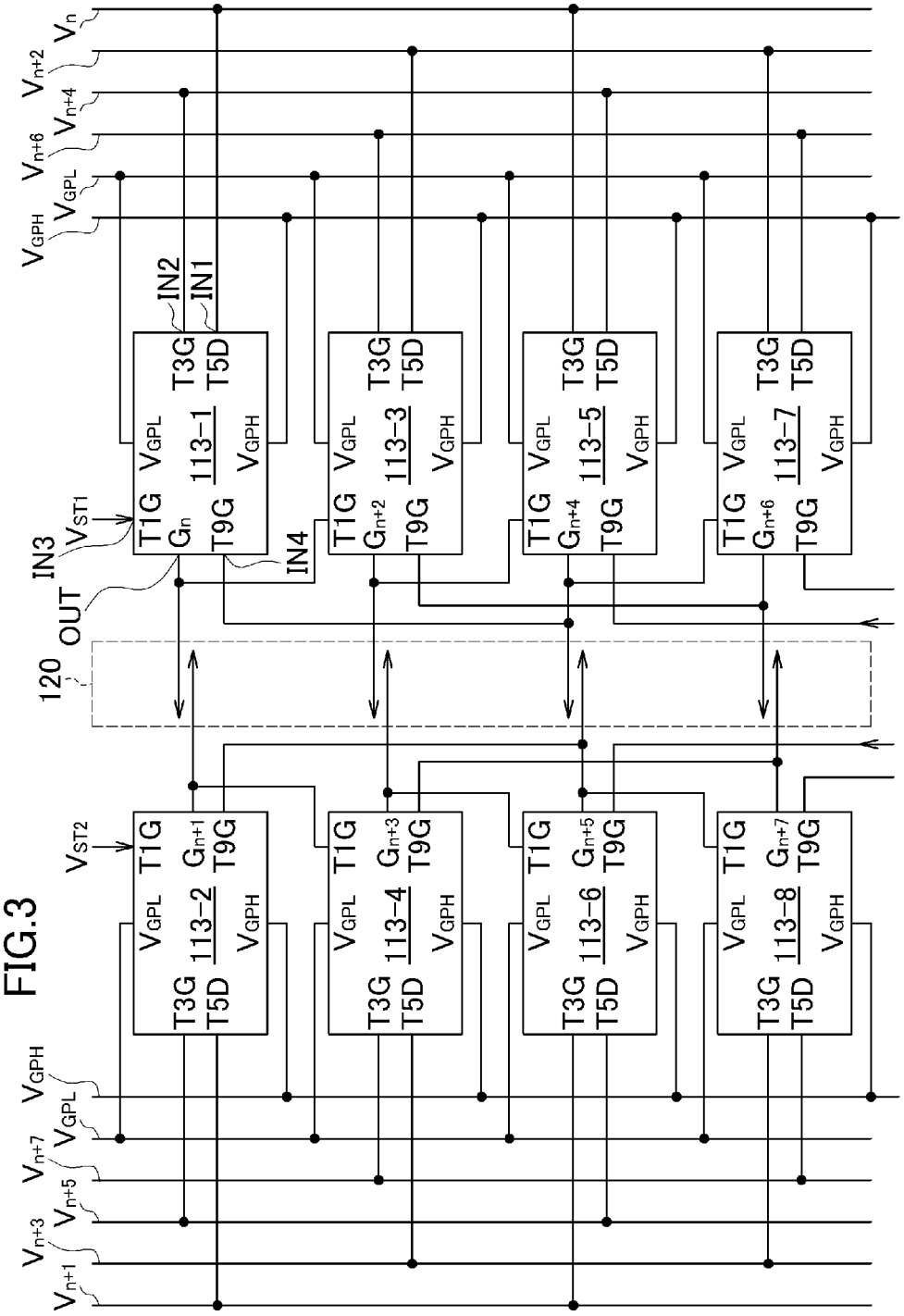
FIG. 3 is a block diagram of a shift register circuit according to the first embodiment of the invention.

FIG. 3 shows a block diagram of the shift register circuit 112. Among the plurality of shift register basic circuits 113 provided for the shift register circuit 112, odd-numbered shift register basic circuits 113 are disposed at the right side in FIG. 3, even-numbered shift register basic circuits 113 are disposed at the left side in FIG. 3, and the respective shift register basic circuits 113 output the gate signals to a display region 120 located at the center in FIG. 3. In FIG. 3, an $n^{th}$ shift register basic circuit is described as a shift register basic circuit 113-$n$. The control signals 115 that are output to the shift register circuit 112 by the shift register control circuit 114 are input to the odd-numbered shift register basic circuits 113 located at the right side in FIG. 3 and the even-numbered shift register basic circuits 113 located at the left side in FIG. 3.

Four clock signal lines are connected to the odd-numbered shift register basic circuits 113, respectively. To the four clock signal lines, at the time of the normal screen display, clock signals $V_n$, $V_{n+2}$, $V_{n+4}$, and $V_{n+6}$ of a predetermined cycle T with four phases different from each other are input, respectively, and for a predetermined period at the time of a screen non-display, a high voltage is applied. Four clock signal lines different from the above-described four clock signal lines are connected to the even-numbered shift register basic circuits 113. To the four clock signal lines, at the time of the normal screen display, clock signals $V_{n+1}$, $V_{n+3}$, $V_{n+5}$, and $V_{n+7}$ of a predetermined cycle T with four phases different from each other are input, respectively, and for a predetermined period at the time of a screen non-display, a high voltage is applied.

Furthermore, a variable high voltage line $V_{GPH}$ and a variable low voltage line $V_{GPL}$ are connected to the odd-numbered and even-numbered shift register basic circuits 113. To the variable high voltage line $V_{GPH}$, at the time of the normal screen display, a high voltage is applied, and for the predetermined period at the time of the screen non-display, a low voltage is applied. Similarly, to the variable low voltage line $V_{GPL}$, at the time of the normal screen display, a low voltage is applied, and for the predetermined period at the time of the screen non-display, a high voltage is applied.

Here, in general, clock signals of m phases will be described. The clock signals of m phases are clock signals with phases different from each other in a predetermined cycle T. In the case of the clock signals of m phases in which the cycle of the clock signals is set to T, one cycle T may be divided into T/m periods. When a period of T/m is referred to as one clock, the one cycle T includes m clocks.

In regard to the clock signals $V_n$, $V_{n+2}$, $V_{n+4}$, and $V_{n+6}$ with four phases and the clock signals $V_{n+1}$, $V_{n+3}$, $V_{n+5}$, and $V_{n+7}$ with four phases, one clock corresponds to a period (2H) of two times a horizontal period (H) that is a data writing period of image data into one pixel circuit, and phases of the clock signals $V_n$, $V_{n+2}$, $V_{n+4}$, and $V_{n+6}$ with four phases and phases of the clock signals $V_{n+1}$, $V_{n+3}$, $V_{n+5}$, and $V_{n+7}$ with four phases are different from each other by a phase corresponding to a half clock (a phase corresponding to one horizontal period (1H)), respectively.

Each of the shift register basic circuits 113 shown in FIG. 3 is provided with four input terminals IN1, IN2, IN3, and IN4, and one output terminal OUT as shown in a first shift register basic circuit 113-1.

The input terminals IN1 and IN2 of an $n^{th}$ shift register basic circuit 113-$n$ will be described. In regard to the $n^{th}$ shift register basic circuit 113-$n$, two clock signal lines to which the clock signal $V_n$ and $V_{n+4}$ at the time of the normal screen display are input are connected to the input terminals IN1 and IN2, respectively. Here, when a value of n of the $n^{th}$ shift register basic circuit 113-$n$ varies, a value of n of the input clock signal $V_n$ and $V_{n+4}$ also varies accordingly, but a clock signal, which connects, is expressed by using a relational equation such as $V_{n+8}=V_n=V_{n-8}$.

A gate signal, which is output to a corresponding gate signal line 105 from the output terminal OUT of the $n^{th}$ shift register basic circuit 113-$n$, is defined as a gate signal $G_n$. That is, the $n^{th}$ shift register basic circuit 113-$n$ outputs the gate signal $G_n$ to the gate signal line 105 connected to the output terminal OUT. A gate signal line 105, which is connected to the output terminal OUT of n−$2^{th}$ shift register basic circuit 113-($n$−2), is connected to the input terminal IN3 of the $n^{th}$ shift register basic circuit 113-$n$, and a gate signal $G_{n-2}$ is input to the input terminal IN3 of the $n^{th}$ shift register basic circuit 113-$n$. Similarly, a gate signal $G_{n+4}$ of n+$4^{th}$ shift register basic circuit 113-($n$+4) is input to the input terminal IN4 of the $n^{th}$ shift register basic circuit 113-$n$. In addition, auxiliary signals $V_{ST1}$ and $V_{ST2}$ are input to the input terminals IN3 of the first shift register basic circuit 113-1 and the second shift register basic circuit 113-2, respectively, because a corresponding gate signal is not present. Here, the auxiliary signals $V_{ST1}$ and $V_{ST2}$ are signals that are set to a high voltage in response to the startup of one frame period.

In addition, the shift register circuit 112 is further provided with a plurality of dummy circuits. A gate signal $G_{801}$ of an $801^{st}$ dummy circuit, a gate signal $G_{802}$ of an $802^{nd}$ dummy circuit, a gate signal $G_{803}$ of an $803^{rd}$ dummy circuit, and a gate signal $G_{804}$ of an $804^{th}$ dummy circuit are input to the input terminals IN4 of a $797^{th}$ shift register basic circuit 113-797, a $798^{th}$ shift register basic circuit 113-798, a $799^{th}$ shift register basic circuit 113-799, and an $800^{th}$ shift register basic circuit 113-800, respectively, the auxiliary signal $V_{ST1}$ is input to the input terminals IN4 of the $801^{st}$ and $803^{rd}$ dummy circuits, and the auxiliary signal $V_{ST2}$ is input to the input terminals IN4 of the $802^{nd}$ and $804^{th}$ dummy circuits, respectively.

Figure 4:
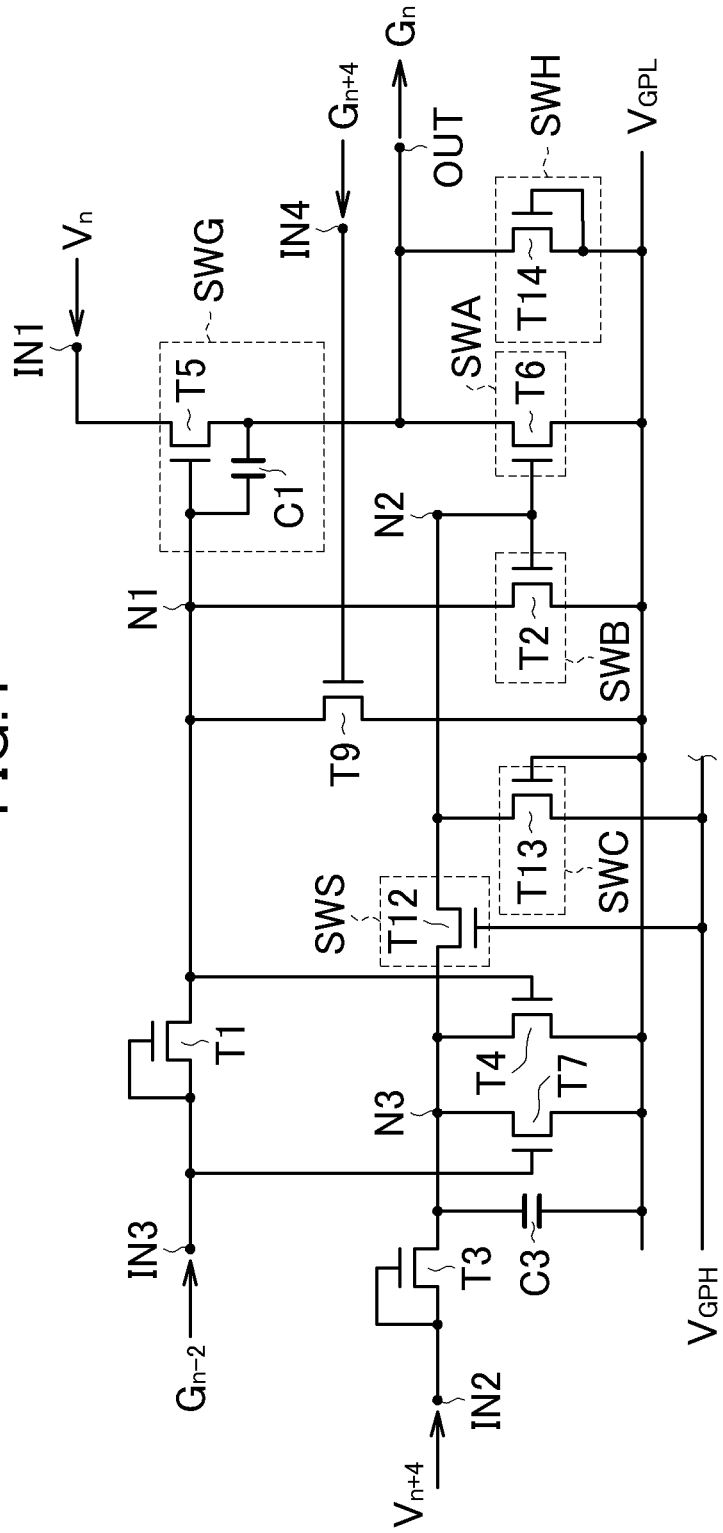
FIG. 4 is a circuit diagram of an $n^{th}$ shift register basic circuit of the shift register circuit according to the first embodiment of the invention.

FIG. 4 shows a circuit diagram of the $n^{th}$ shift register basic circuit 113-$n$ of the shift register circuit 112 according to this embodiment. All transistors shown in FIG. 4 are NMOS transistors, an on-voltage of the respective transistors is a high voltage, and an off-voltage is a low voltage. Therefore, a second reference voltage line that is set to the off-voltage at the time of the normal screen display is connected to a first reference voltage line that is set to the low voltage at the time of the normal screen display. In the drawing, the first reference voltage line and the second reference voltage line are expressed as a variable low voltage line $V_{GPL}$.

As shown in FIG. 4, a transistor T5 and a voltage-raising capacitor C1 correspond to a gate line high voltage applying circuit SWG, and a voltage connected to a gate of the transistor T5 that is a switch of the gate line high voltage applying circuit SWG is a node N1. The input terminal IN1 is connected to an input side of the transistor T5, and a clock signal line to which the clock signal $V_n$ is input at the time of the normal screen display is connected to the input terminal IN1. The output terminal OUT is connected to an output side of the transistor T5. When the on-voltage (high voltage) is applied to the node N1, the transistor T5 is turned on, and the transistor T5 applies a voltage of a clock signal line connected to the input terminal IN1 to the output terminal OUT while the transistor T5 is in on-state.

A transistor T6 corresponds to the gate line low voltage applying circuit SWA, and a voltage connected to the gate of the transistor T6 that is a switch of the gate line low voltage applying circuit SWA is a node N2. The first reference voltage line that is set to a low voltage at the time of the normal screen display is connected to an input side of the transistor T6, but as described above, here, the first reference voltage line is the variable low voltage line $V_{GPL}$. In addition, the output terminal OUT is connected to an output side of the transistor T6. When an on-voltage (high voltage) is applied to the node N2, the transistor T6 is turned on, and the transistor T6 applies a voltage of the first reference voltage line (variable low voltage line $V_{GPL}$) to the output terminal OUT while the transistor T6 is in on-state.

A transistor T2 corresponds to a high voltage application off-control circuit SWB, and a voltage, which is connected to a gate of the transistor T2 that is a switch of the high voltage application off-control circuit SWB, is the node N2 similarly to the voltage connected to the gate of the transistor T6. The second reference voltage line, which is set to an off-voltage at the time of the normal screen display, is connected to an input side of the transistor T2, but as described above, here, the second reference voltage line is the variable low voltage line $V_{GPL}$. The node N1 is connected to an output side of the transistor T2. When an on-voltage (high voltage) is applied to the node N2, the transistor T2 is turned on, and the transistor T2 applies a voltage of the second reference voltage line (variable low voltage line $V_{GPL}$) to the node N1 while the transistor T2 is in on-state.

A transistor T14 corresponds to a screen non-display period gate line high voltage applying circuit SWH, and a gate and an input side of the transistor T14 are diode-connected. The variable low voltage line $V_{GPL}$ is connected to the gate and the input side of the transistor T14, and the output terminal OUT is connected to an output side of the transistor T14. At the time of the normal screen display, the gate and the input side of the transistor T14 are held at a low voltage of the variable low voltage line $V_{GPL}$, so that the transistor T14 is in off-state. In addition, for a predetermined period at the time of the screen non-display, the variable low voltage line $V_{GPL}$ is set to a high voltage and the gate and the input side of the transistor T14 are held at the high voltage, so that the transistor T14 enters on-state. The transistor T14 applies the high voltage of the variable low voltage line $V_{GPL}$ to the output terminal OUT while the transistor T14 is in on-state.

A transistor T3 and a holding capacitor C3 correspond to a low voltage application on-control circuit, and the transistor T3 corresponds to an on-application switching element provided for the low voltage application on-control circuit. A gate and an input side of the transistor T3 are diode-connected, the input terminal IN2 is connected to the gate and the input side of the transistor T3, another clock signal line to which a clock signal $V_{n+4}$ at the time of the normal screen display is input is connected to the input terminal IN2. A voltage connected to an output side of the transistor T3 is a node N3. When the clock signal $V_{n+4}$ is a high voltage, the transistor T3 is turned on, and the transistor T3 applies a voltage of the other clock signal line to which the clock signal $V_{n+4}$ is input to the node N3 while the transistor T3 is in on-state. The holding capacitor C3 is disposed between the output side (node N3) of the transistor T3 and the variable low voltage line $V_{GPL}$. In addition, here, the holding capacitor C3 is disposed to be adjacent to the transistor T3, but this disposition is not limited thereto. The holding capacitor C3 may be disposed at an arbitrary position as long as the holding capacitor C3 is provided between the node N3 or node N2 and the variable low voltage line $V_{GPL}$.

A transistor T12 corresponds to a screen non-display period off-control switching element SWS, and the transistor T12 is provided between the output side (node N3) of the transistor T3 and the gate (node N2) of the transistor T6, and the variable high voltage line $V_{GPH}$ is connected to a gate of the transistor T12 that is a switch of the screen non-display period off-control switching element SWS. At the time of the normal screen display, the variable high voltage line $V_{GPH}$ is held at a high voltage, an on-voltage (high voltage) is applied to the gate of the transistor T12 and thereby the transistor T12 is turned on, and the node N2 and the node N3 are electrically connected to each other while the transistor T12 is in on-state. Therefore, the on-voltage applied to gate of the transistor T6 is set to the high voltage of the clock signal $V_{n+4}$. In addition, for a predetermined period at the time of the screen non-display, the variable high voltage line $V_{GPH}$ is held at a low voltage, an off-voltage (low voltage) is applied to the gate of the transistor T12, and thereby the transistor T12 is turned off. As a result, the transistor T12 electrically insulates the node N2 and the node N3.

A transistor T13 corresponds to a screen non-display period switch off-voltage applying circuit SWC. The variable low voltage line $V_{GPL}$ is connected to a gate of the transistor T13 that is a switch of the screen non-display period switch off-voltage applying circuit SWC, the variable high voltage line $V_{GPH}$ is connected to an input side thereof, and the node N2 is connected to an output side thereof. At the time of the normal screen display, the low voltage of the variable low voltage line $V_{GPL}$ is applied to the gate of the transistor T13, and thereby the transistor T13 enters off-state. For a predetermined period at the time of the screen non-display, the high voltage of the variable low voltage line $V_{GPL}$ is applied to the gate of the transistor T13 and thereby the transistor T13 enters on-state, and the transistor T13 applies the low voltage of the variable high voltage line $V_{GPH}$ to the node N2.

The $n^{th}$ shift register basic circuit 113-$n$ according to this embodiment is further provided with a transistor T1, a transistor T4, a transistor T7, and a transistor T9. A gate and an input side of the transistor T1 are diode-connected, the input terminal IN3 is connected to the gate and the input side of the transistor T1, and a gate signal $G_{n-2}$ is input to the input terminal IN3. The node N1 is connected to an output side of the transistor T1. The node N1 is connected to a gate of the transistor T4, and the variable low voltage line $V_{GPL}$ and the node N3 are connected to an input side and an output side thereof, respectively. The input terminal IN3 is connected to a gate of the transistor T7, the variable low voltage line $V_{GPL}$ is connected to an input side thereof, and the node N3 is connected to an output side thereof. The input terminal IN4 is connected to a gate of the transistor T9, and a gate signal $G_{n+4}$ is input to the input terminal IN4. The variable low voltage line $V_{GPL}$ and the node N1 are connected to an input side and an output side of the transistor T9, respectively.

Figure 5:
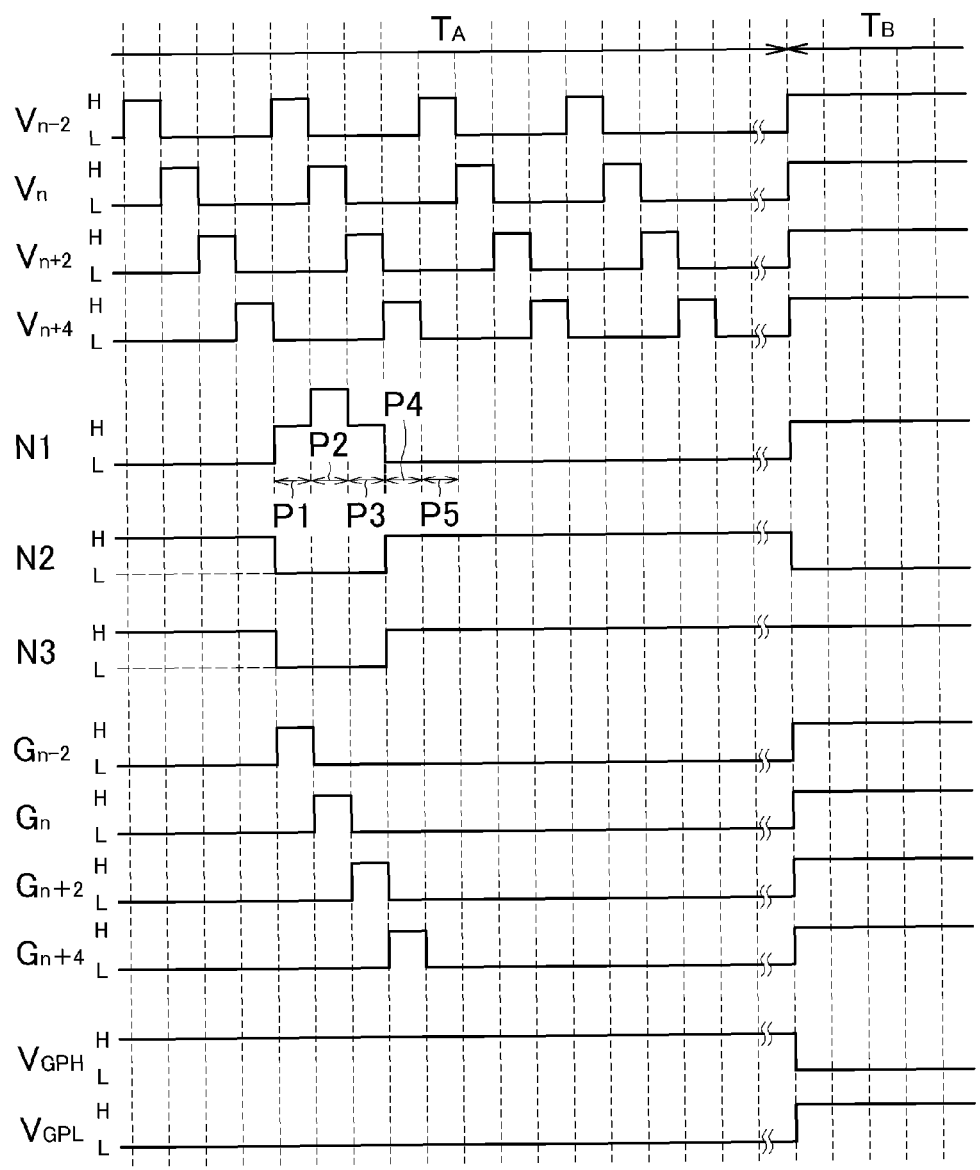
FIG. 5 is a diagram illustrating a drive method of the $n^{th}$ shift register basic circuit according to the first embodiment of the invention.

FIG. 5 illustrates a drive method of the $n^{th}$ shift register basic circuit 113-$n$ according to this embodiment, and time changes of the nodes N1, N2, and N3 are expressed together with voltages of four clock signal lines to which clock signals with four phases are input, respectively, and voltages of the variable high voltage line $V_{GPH}$ and the variable low voltage line $V_{GPL}$. In addition, in the drawing, a high voltage and a low voltage are expressed by H and L, respectively. The clock signal $V_n$ is set to the high voltage for a signal high period in which the gate signal $G_n$ output from the $n^{th}$ shift register basic circuit 113-$n$ is set to the high voltage.

In addition, in FIG. 5, a time when the normal screen display is performed is expressed by a period $T_A$, and a predetermined period at the time of the screen non-display is expressed by a period $T_B$. Here, the predetermined period at the time of the screen non-display is, for example, at least a part of a period in which power is supplied but a liquid crystal display device according to this embodiment is not activated yet, or at least a part of the period in which the backlight 103 is turned off and thereby it becomes a screen non-display state while activating the liquid crystal display device according to this embodiment in a case where the backlight 103 provided for the liquid crystal display device according to this embodiment is a LED or the like, for example, at the time of Deep Stand-by. That is, the predetermined period at the time of the screen non-display is included in a period in which a light source is not turned on during activation.

Hereinafter, a drive method of the shift register basic circuit 113 with the time changes shown in FIG. 5 will be described. First, a drive method for the period $T_A$ at the time of the normal screen display will be described. For the period $T_A$, the node N1 is held at the low voltage and the node N2 and node N3 are held at the high voltage in response to the signal low period. Periods (clocks) indicated by arrows in the drawing are set to P1, P2, P3, P4, and P5. As described above, for the period $T_A$, the variable high voltage line $V_{GPH}$ is held at the high voltage, the transistor T12 enters on-state, and the node N2 and the node N3 are electrically connected to each other. Therefore, for the period $T_A$, the same time change occurs in the node N2 and the node N3.

As described above, since the node N2 is held at the high voltage in response to the signal low period, the high voltage of the node N2 is applied to the gate of the transistor T6 and the gate of the transistor T2, respectively, and thereby the transistor T6 and the transistor T2 become on-state. Therefore, the transistor T6 and the transistor T2 apply the low voltage of the variable low voltage line $V_{GPL}$ to the output terminal OUT and the node N1, respectively. In addition, the low voltage of the node N1 is applied to the gate of the transistor T5, and thereby the transistor T5 enters off-state.

At the beginning of the period P1 shown in FIG. 5, the gate signal $G_{n-2}$ of the n-$2^{th}$ shift register basic circuit 113-($n$-2) varies from the low voltage to the high voltage and thereby the transistors T1 and T7 are turned on. The transistor T7 in on-state applies the low voltage of the variable low voltage line $V_{GPL}$ to the node N3, and the node N3 varies from the high voltage to the low voltage. The node N2 in on-state that is electrically connected to the node N3 through the transistor T12 also varies from the high voltage to the low voltage. In addition, the transistor T1 in on-state applies the high voltage of the gate signal $G_{n-2}$ to the node N1, and the node N1 varies from the low voltage to the high voltage. Therefore, as shown in FIG. 5, for the period P1, the node N1 varies to the high voltage, and the node N2 and the node N3 vary to the low voltage.

In response to the timing at which the node N2 varies to the low voltage, the transistors T2 and T6 are turned off, respectively. When the transistor T6 is turned off, the output terminal OUT is electrically insulated from the variable low voltage line $V_{GPL}$. When the transistor T2 is turned off, the node N1 is electrically insulated from the variable low voltage line $V_{GPL}$. In response to the timing at which the node N1 varies to the high voltage, the transistors T4 and T5 are turned on. While the transistor T5 is in on-state, the clock signal $V_n$ input to the input terminal IN1 is output to the output terminal OUT. The transistor T4 in on-state applies the low voltage of the variable low voltage line $V_{GPL}$ to the node N3, and the node N2 and the node N3 are held at the low voltage.

At the beginning of the period P2 shown in FIG. 5, the gate signal $G_{n-2}$ of the n-$2^{th}$ shift register basic circuit 113-($n$-2) varies from the high voltage to the low voltage, and the transistors T1 and T7 are turned off. Even after the transistor T1 is turned off, the node N1 is held at the high voltage and the transistor T5 is held at on-state. For the period P2, since the clock signal $V_n$ is set to the high voltage, for the period P2 that is a signal high period, the transistor T5 applies the high voltage of the clock signal $V_n$ to the output terminal OUT, and the gate signal $G_n$ that is set to the high voltage is output to the corresponding gate signal line 105 from the output terminal OUT.

Even after the transistor T7 is turned off, the node N1 is held at the high voltage, the transistor T4 is held at on-state, and the node N2 and the node N3 are maintained at the low voltage.

Here, actually, since the threshold voltage $V_{TH}$ is present in the transistor T1, for the period P1, the voltage of the node N1 becomes a voltage obtained by subtracting the threshold voltage $V_{TH}$ of the transistor T1 from the high voltage of the gate signal $G_{n-2}$. With this voltage, for the period P2 that is a signal high period, the transistor T5 may not be turned on sufficiently, so that in the gate line high voltage applying circuit SWG, the voltage-raising capacitor C1 is provided between the gate and the output side of the transistor T5, and the voltage-raising capacitor C1 is connected to the transistor T5 in parallel. When reaching the period P2, the gate signal $G_{n-2}$ varies to the low voltage and thereby the transistor T1 is turned off, but the node N1 is held at the high voltage and thereby the transistor 15 is held at on-state. For the period P2, the high voltage of the clock signal $V_n$ that is input to the input terminal IN1 is applied to the output side of the transistor T5, and the voltage of node N1 is raised to a further high voltage due to a capacitance coupling of the voltage-raising capacitor C1. This is called a bootstrap voltage. For the period P2, as shown in FIG. 5, the node N1 becomes a bootstrap voltage higher than the high voltage.

At the beginning of the period P3 shown in FIG. 5, the clock signal $V_n$ varies from the high voltage to the low voltage, but due to the voltage-raising capacitor C1, the node N1 is held at the high voltage, and the transistors T4 and T5 are held at on-state. Therefore, the clock signal $V_n$ is set to the low voltage for the period P3, so that for the period P2, the transistor T5 in on-state applies the low voltage of the clock signal $V_n$ to the output terminal OUT, and the gate signal $G_n$ that is set to the low voltage is output to the corresponding gate signal line 105 from the output terminal OUT. In addition, due to the transistor T4 in on-state, the node N2 and the node N3 are held at the low voltage, and the transistors T2 and T6 are held at off state.

At the beginning of the period P4, the gate signal $G_{n+4}$ of n+4$^{th}$ shift register basic circuit 113-(n+4) varies from the high voltage to the low voltage, the transistor T9 is turned on, the low voltage of the variable low voltage line $V_{GPL}$ is applied to the node N1, and the node N1 varies from the high voltage to the low voltage. In response to the timing when the node N1 varies to the low voltage, the transistors T4 and T5 are turned off, respectively.

At the beginning of the period P4, the clock signal $V_{n+4}$ varies from the low voltage to the high voltage, and the transistor T3 is turned on. The transistor T3 in on-state applies the high voltage of the clock signal $V_{n+4}$ to the node N3, and the node N2 and the node N3 vary from the low voltage to the high voltage. In response to the timing when the node N2 and the node N3 vary to the high voltage, the transistors T2 and T6 are turned on, respectively, and the holding capacitor C3 is charged to the high voltage.

For the periods P1, P2, and P3, the node N1 is held at the high voltage, and the node N2 and the node N3 are held at the low voltage, but for the period P4, the node N1 varies to the low voltage, and the node N2 varies to the high voltage.

Then, at the beginning of the period P5, the clock signal $V_{n+4}$ varies from the high voltage to the low voltage, and the transistor T3 is turned off. Even after the transistor T3 is turned off, due to the holding capacitor C3, the voltages of the node N2 and the node N3 are held at the high voltage. Furthermore, the clock signal $V_{n+4}$ is periodically set to the high voltage, and the holding capacitor C3 is periodically continuously charged, so that the voltages of the node N2 and the node N3 are stably held at the high voltage. Therefore, even after the period P5, the node N1 is held at the low voltage, and the node N2 is held at the high voltage.

Hereinbefore, description has been made with respect to the drive method for the period $T_A$ at the time of the normal screen display. Next, a drive method for a period $T_B$ that is a predetermined period at the time of a screen non-display will be described. As shown in FIG. 5, overall voltages of four clock signal lines to which clock signals with four phases at the time of the normal screen display are input, respectively, are set to the high voltage for the period $T_B$. In addition, as described above, for the period $T_B$, the variable high voltage line $V_{GPH}$ is set to the low voltage, and the variable low voltage line $V_{GPL}$ is set to the high voltage.

At the beginning of the period $T_B$, the variable high voltage line $V_{GPH}$ varies from the high voltage to the low voltage, and the variable low voltage line $V_{GPL}$ varies from the low voltage to the high voltage. The low voltage of the variable high voltage line $V_{GPH}$ is applied to the gate of the transistor T12, and thereby the transistor T12 is turned off and the node N2 and the node N3 are electrically insulated from each other. In addition, the high voltage of the variable low voltage line $V_{GPL}$ is applied to the gate of the transistor T13, and thereby the transistor T13 is turned on. The transistor T13 in on-state applies the low voltage of the variable high voltage line $V_{GPH}$ to the node N2, and the node N2 varies from the high voltage to the low voltage. In response to the timing when the node N2 varies to the low voltage, the transistors T2 and T6 are turned off, respectively.

When the variable low voltage line $V_{GPL}$ varies from the low voltage to the high voltage, the transistor T14 is turned on, and the transistor T14 in on-state applies the high voltage of the variable low voltage line $V_{GPL}$ to the output terminal OUT. Therefore, the gate signal $G_n$ output from the output terminal OUT varies from the low voltage to the high voltage. That is, the voltage of the gate signal line 105 connected to the output terminal OUT varies from the low voltage to the high voltage. Since this variation occurs in the n–2$^{th}$ shift register basic circuit 113-(n–2) and the n+4$^{th}$ shift register basic circuit 113-(n+4), the gate signal line 105 (gate signal $G_{n-2}$) that is connected to the input terminal IN3, and the gate signal line 105 (gate signal $G_{n+4}$) that is connected to the input terminal IN4 vary from the low voltage to the high voltage. Therefore, the transistor T1 is turned on, and the transistor T1 in on-state applies the high voltage of the gate signal line 105 to the node N1. In addition, the transistor T7 is turned on, and the transistor T7 in on-state applies the high voltage of the variable low voltage line $V_{GPL}$ to the node N3. Furthermore, the transistor T9 is turned on, and the transistor T9 in on-state applies the high voltage of the variable low voltage line $V_{GPL}$ to the node N1. Therefore, the node N1 varies from the low voltage to the high voltage. In response to the timing when the node N1 varies to the high voltage, the transistor T4 is turned on, and the transistor T4 in on-state applies the high voltage of the variable low voltage line $V_{GPL}$ to the node N3.

In addition, here, either the n–2$^{th}$ shift register basic circuit 113-(n–2) or the n+4$^{th}$ shift register basic circuit 113-(n+4) (or both of them) corresponds to another shift register basic circuit that outputs the gate signal to another gate signal line. The gate signal line 105 that is connected to an output terminal OUT of the n–2$^{th}$ shift register basic circuit 113-(n–2) is another gate signal line that is different from the gate signal line 105 that is connected to the output terminal OUT of the n$^{th}$ shift register basic circuit 113-n, and the signal high period of the gate signal $G_{n-2}$ at the time of the normal screen display is another signal high period that is different from the signal high period of the gate signal $G_n$. The signal low period of the gate signal $G_{n-2}$ overlaps the signal low period of the gate signal $G_n$, but is another signal low period that is different from the signal low period of the gate signal $G_n$. This is true of the n+4$^{th}$ shift register basic circuit 113-(n+4). In the transistor T1 and the transistor T9 of the n$^{th}$ shift register basic circuit 113-n, another gate signal line is connected to the gates (switches) thereof, and for a predetermined period at the time of the screen non-display, the on-voltage (high voltage) is applied to the node N1, so that either the transistor T1 or the transistor T9 (or both of them) corresponds to a screen non-display period high voltage application on-control circuit.

In addition, at the beginning of the period $T_B$, the four clock signal lines vary from the low voltage to the high voltage, the transistor T5 in on-state applies the high voltage of the corresponding clock signal line to the output terminal OUT, and therefore the gate signal line 105 that is connected to the output terminal OUT is held at the high voltage in a more stable manner. In addition, the transistor T3 in on-state applies the high voltage of clock signal line to the node N3.

A characteristic of the gate signal line drive circuit according to this embodiment is in that the transistor T13 that is the screen non-display period switch off voltage applying circuit SWC sets the node N2 to the low voltage for the predetermined period at the time of the screen non-display, and thereby the transistor T6 that is the gate line low voltage applying circuit SWA is made to be turned off. At the time of the normal screen display, over a long period in one frame period, the high voltage is applied to the gate of the transistor T6, the threshold voltage $V_{TH}$ of the transistor T6 is shifted to a positive side, and element characteristics of the transistor T6 would deteriorate. When the transistor T6 is held at off-state for the predetermined period at the time of the screen non-display, the threshold voltage $V_{TH}$ of the transistor T6 is shifted to an opposite side (negative side), an absolute value of the threshold voltage $V_{TH}$ decreases, and therefore the element characteristics of the transistor T6 at the time of the next screen display are improved. Furthermore, when the voltage of the first reference voltage line (the variable low voltage line $V_{GPL}$) that is connected to the input side of the transistor T6 is set to the high voltage for the predetermined period at the time of the screen non-display, the shift of the threshold voltage $V_{TH}$ of the transistor T6 to the opposite side (negative side) is further enhanced, and therefore the element characteristics of the transistor T6 are further improved.

The transistor T14 that is the screen non-display period gate line high voltage applying circuit SWH sets the voltage of the output terminal OUT and the gate signal line 105 that is connected thereto to the high voltage for the predetermined period at the time of the screen non-display. Therefore, the voltage of the output side of the transistor T6 becomes the high voltage, so that the shift of the threshold voltage $V_{TH}$ of the transistor T6 to the opposite side (negative side) is further enhanced, and therefore the element characteristics of the transistor T6 are further improved.

Similarly to the transistor T6, at the time of the normal screen display, over a long period during one frame, the high voltage is applied to the gate of the transistor T2, and therefore the threshold voltage $V_{TH}$ of the transistor T2 is shifted to a positive side. For the predetermined period at the time of the screen non-display, the transistor T2 is held at off-state, so that the absolute value of the threshold voltage $V_{TH}$ of the transistor T2 decreases, and therefore the characteristics of the transistor T2 are improved at the time of the next screen display. Furthermore, similarly to the transistor T6, the voltage of the second reference voltage line (variable low voltage line $V_{GPL}$) that is connected to the input side of the transistor T2 is set to the on-voltage (high voltage), so that the shift of the threshold voltage $V_{TH}$ of the transistor T2 to an opposite side (negative side) is further enhanced, and therefore the element characteristics of the transistor T2 are further improved.

In regard to the transistors T1 and T9 that correspond to the screen non-display period high voltage application on-control circuit, the gate signal lines 105, which are connected to the transistors T1 and T9, respectively, for the predetermined period at the time of the screen non-display, are set to the high voltage, so that the transistors T1 and T9, which become on-state, set the voltage of the node N1 to the high voltage. When the node N1 is set to the high voltage, the voltage of the output side of the transistor T2 becomes the high voltage, so that the shift of the threshold voltage $V_{TH}$ of the transistor T2 to the opposite side (negative side) is further enhanced, and therefore the element characteristics of the transistor T2 are further improved.

As described above, when the screen display is performed after the predetermined period at the time of the screen non-display, for a signal low period in one frame period, the transistor T6 stably applies the low voltage to the output terminal OUT, and the transistor T2 stably makes the transistor T5 into off-state, so that a noise of the gate signal $G_n$ is suppressed, and a quality of a screen display that is displayed by a display device is further improved.

In regard to the shift register basic circuit 113, the deterioration in the element characteristics of the two transistors in on-state over a long period in one frame period at the time of the normal screen display may be suppressed, so that a long operating life of an element is realized, and therefore a long operating life of a shift register drive circuit and a display device using the element is realized. In addition, for example, when a plurality of switching elements may be provided to the gate line low voltage applying circuit SWA or the high voltage application off-control circuit SWB, respectively, to reduce a period in which the high voltage is applied to the respective switching elements, the deterioration in characteristics of the switching elements may be suppressed. However, in this case, a circuit size of the shift register basic circuit becomes large. Therefore, in the shift register basic circuit 113 according to this embodiment, this suppression may be realized by only adding several switching elements (transistors T12, T13, and T14), and therefore the characteristics of the shift register basic circuit 113 are improved while suppressing the increase in size of the circuit. When the increase in circuit size is suppressed, it is possible to make small an area of a frame region in which the gate signal line drive circuit is disposed, that is, at the periphery of the display region 120, and it is possible to cope with a demand for high definition.

Hereinbefore, description has been made with respect to the improvement in characteristics of the gate signal line drive circuit according to this embodiment, but the display device according to this embodiment has effects described below. At the time of the normal screen display, as shown in FIG. 2, to the gate of the TFT 109 of a pixel circuit, the high voltage is applied for a period (signal high period) in which the gate signal $G_n$ that is input to the connected gate signal line 105 is set to the high voltage, and the low voltage is applied for a period (signal low period) other than the above-described period. Since the signal low period is long in one frame period, the threshold voltage $V_{TH}$ of the TFT 109 is shifted to a negative side in a case where the pixel electrode 110 connected to the TFT 109 is held at a high voltage or in a case where the voltage of the video signal line 107 that is connected to the TFT 109 becomes a high voltage. When the shift of the threshold voltage $V_{TH}$ to the negative side becomes large, an off-current of the TFT 109 increases for the signal low period at the time of the normal screen display, and the voltage of the video signal line 107 is applied to the pixel electrode 110 through the TFT 109, and therefore abnormality occurs at the time of the screen display. For example, in a case where only a partial region in one frame (screen) is in a screen display (window display), even when a display control voltage that is set to a dark display is held at the pixel electrode 110 of an arbitrary pixel circuit, when a display control voltage, which is set to a bright display, of another pixel circuit is applied to the video signal line 107 connected to the TFT 109, this display control voltage is applied to the pixel electrode 110 to which the TFT 109 is connected, and therefore a vertical smear occurs. When the shift register basic circuit 113 according to this embodiment is used, since the voltage of the gate signal line 105 becomes the high voltage for the predetermined period at the time of the screen non-display, and the high voltage is applied to the gate of the TFT 109, the threshold voltage $V_{TH}$ of the TFT 109 is shifted to an opposite side (positive side), and the absolute value of the threshold voltage $V_{TH}$ decreases. Therefore, at the time of the next screen display, an off-current in the TFT 109 is suppressed and therefore the abnormality at the time of the screen display is suppressed. That is, the screen display quality is further improved.

In addition, the threshold voltage $V_{TH}$ in the switching element becomes more problematic in a thin film transistor (TFT), particularly, in a thin film transistor (TFT) in which a semiconductor, which is used in a thin film, is formed of amorphous silicon. Therefore, in a case where the gate line low voltage applying circuit SWA or the high voltage application off-control circuit SWB of the gate signal line drive circuit is provided with a switching element including a thin film transistor formed using the amorphous silicon, the effect of the invention further increases. Similarly, in a case where the TFT 109 of the pixel circuit is a thin film transistor formed using the amorphous silicon, the effect of the invention further increases.

In addition, in the gate signal line drive circuit 104 according to this embodiment, each of the shift register basic circuits 113 may be provided with the transistor T14 that is the screen non-display period gate line high voltage applying circuit SWH, but it is not limited thereto. In the case of being driven according to the drive method shown in FIG. 5, the transistor T14 may be provided for at least one shift register basic circuit 113. For example, when the transistor T14 is provided for an arbitrary shift register basic circuit 113, the gate signal line 105 connected to the output terminal OUT of the shift register basic circuit 113 becomes the high voltage. When the input terminal IN3 (or input terminal IN4) of another shift register basic circuit 113 to which the gate signal line 105 is connected is set to the high voltage, the transistor T5 of the other shift register basic circuit 113 applies the high voltage of the clock signal line to the output terminal OUT, and therefore the gate signal line 105 that is connected to the output terminal OUT is set to the high voltage. Successively, the node N1 of the other shift register basic circuit 113 is set to the high voltage, and the gate signal line 105 may be set to the high voltage.

In addition, in the case of being driven according to another drive method, all of the plurality of shift register basic circuits 113 may not be provided with the transistor T14. In response to the beginning of the period $T_B$ that is the predetermined period at the time of the screen non-display, first, the voltage of the variable low voltage line $V_{GPL}$ is changed from the low voltage to the high voltage. The transistor T2 in on-state applies the high voltage of the variable low voltage line $V_{GPL}$ to the node N1, and the node N1 varies from the low voltage to the high voltage. After the node N1 varies to the high voltage, the voltage of the variable high voltage line $V_{GPH}$ is changed from the high voltage to the low voltage. The transistor T13 in on-state applies the low voltage of the variable high voltage line $V_{GPH}$ to the node N2, and the node N2 varies from the high voltage to the low voltage. In response to the timing in which the node N2 varies to the low voltage, the transistors T2 and T6 are turned off. In addition, when the clock signal line that is connected to the input terminals IN1 and IN2 is changed to the high voltage at an appropriate timing, the gate signal line 105 may be set to the high voltage.

Second Embodiment

A display device according to a second embodiment of the invention has basically the same configuration as the display device according to the first embodiment. A main difference from the display device according to the first embodiment is in that the gate signal line drive circuit 104 according to this embodiment may perform a drive in two directions by selecting either a forward direction drive or reverse direction drive.

Figure 6:
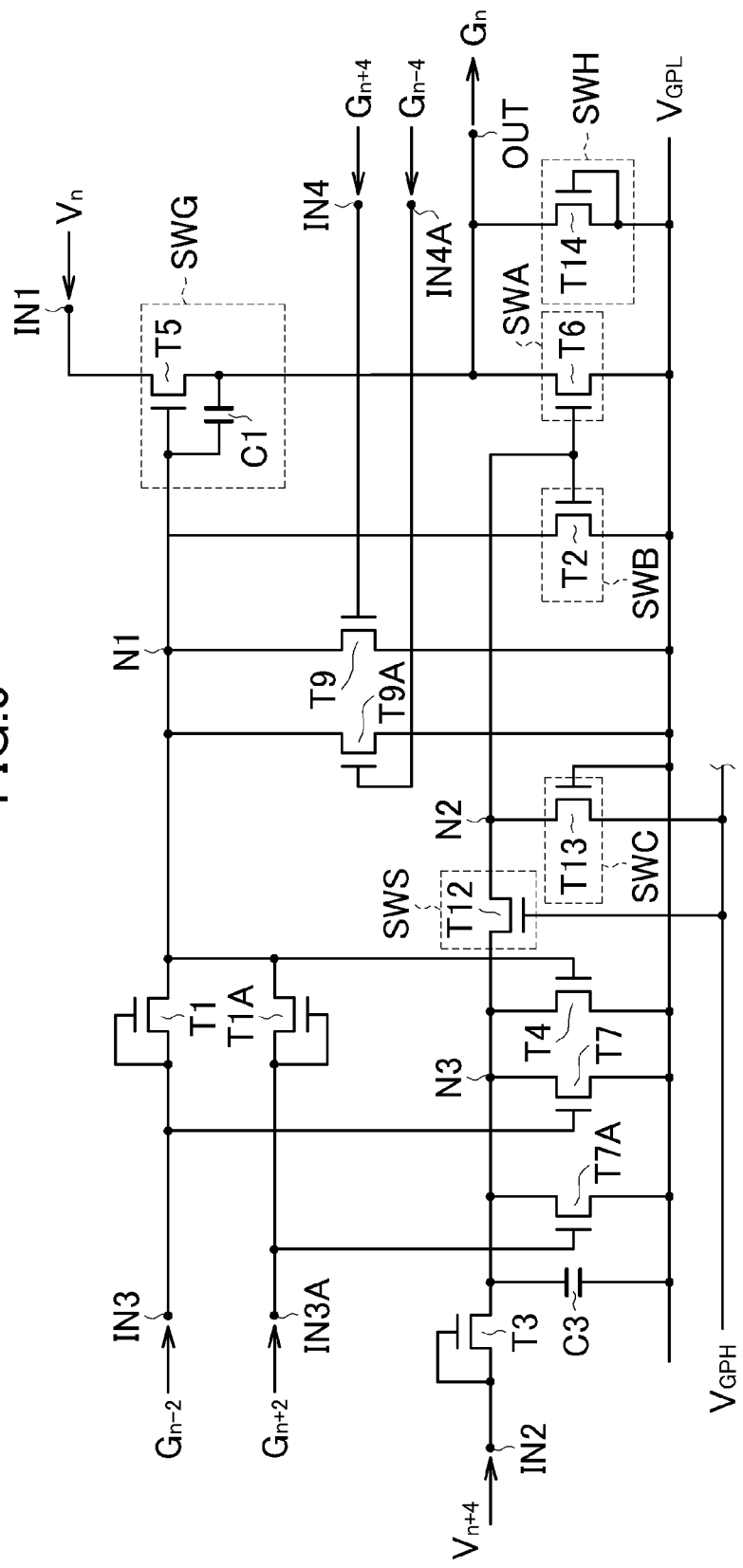
FIG. 6 is a circuit diagram of an $n^{th}$ shift register basic circuit of a shift register circuit according to a second embodiment of the invention.

FIG. 6 shows a circuit diagram of $n^{th}$ shift register basic circuit 113-$n$ of a shift register circuit 112 according to this embodiment. The $n^{th}$ shift register basic circuit 113-$n$ shown in FIG. 6 is further provided with an input terminal IN3A and an input terminal IN4A when compared to the $n^{th}$ shift register basic circuit 113-$n$ according to the first embodiment shown in FIG. 4, and gate signals $G_{n+2}$ and $G_{n-4}$ are input to the input terminals IN3A and IN4A, respectively. The $n^{th}$ shift register basic circuit 113-$n$ according to this embodiment is further provided with transistors T1A, T7A, and T9A. The transistor T1A is disposed in parallel with the transistor T1 with respect to the node N1, a gate and an input side of the transistor T1A are diode-connected to each other, the input terminal IN3 is connected to the gate and the input side of the transistor T1A, and the node N1 is connected to an output side of the transistor T1A. The transistor T7A is disposed between the node N3 and the variable low voltage line $V_{GPL}$ in parallel with the transistor T7, and the input terminal IN3A is connected to a gate of the transistor T7A. The transistor T9A is disposed between the node N1 and the variable low voltage line $V_{GPL}$ in parallel with the transistor T9, and the input terminal IN4A is connected to a gate of the transistor T9A.

In the case of performing the forward direction drive at the time of the normal screen display, the drive method is the same as the drive method according to the first embodiment. For an immediately preceding period (clock) of the period P1 shown in FIG. 5, an n-4$^{th}$ gate signal $G_{n-4}$ is set to the high voltage. For the corresponding period, the high voltage of the gate signal $G_{n-4}$ that is input to the input terminal IN4A is applied to the gate of the transistor T9A, the transistor T9A enters on-state, and the transistor T9A applies the low voltage of the variable low voltage line $V_{GPL}$ to the node N1, but for the corresponding period, the node N1 is held at the low voltage, and therefore the voltage of the node N1 does not vary. Similarly, for the period P3 shown in FIG. 5, the n+2$^{th}$ gate signal $G_{n+2}$ becomes the high voltage. For the period P3, the transistors T1A and T7A become on-state, the high voltage of the gate signal $G_{n+2}$ is applied to the node N1 through the transistor T1A in on-state, and the transistor T7A applies the low voltage of the variable low voltage line $V_{GPL}$, but for the period P3, the node N1 is held at the high voltage and the node N3 is held at the low voltage, so that the voltage of each of the node N1 and the node N3 does not vary.

In regard to a drive method in the case of performing the reverse direction drive at the time of the normal screen display, clock signals with four phases are set to the high voltage in a sequence opposite to that of the clock signals $V_n$ with four phases shown in FIG. 5. Therefore, in a sequence opposite to that of the gate signals $G_n$ shown in FIG. 5, the gate signals output from the shift register basic circuit 113 are set to the high voltage in the order from a side in which a value of n is large to a side in which a value of n is small. That is, signal high periods are set in this order. Therefore, in the case of performing the reverse direction drive, when the gate signal $G_{n+2}$ varies to the high voltage, the transistor T1A applies the high voltage to the node N1, and the transistor T7A applies the low voltage to the node N3. Furthermore, when the gate signal $G_{n-4}$ varies to the high voltage, the transistor T9A applies the low voltage to the node N1. In the case of performing the reverse direction drive, even when the gate signal $G_{n+4}$ varies to the high voltage, a variation does not occur in the node N1, and even when the gate signal $G_{n-2}$ varies to the high voltage, a variation in voltage does not occur in the node N1 and the node N3. In addition, a drive method for the predetermined period at the time of the screen non-display is the same as that for the period $T_B$ shown in FIG. 5, even in the case of performing the forward direction drive or in the case of performing the reverse direction drive.

As shown in FIG. 6, the shift register basic circuit 113 has a configuration in which a bidirectional drive is possible, and a display device according to this embodiment may perform the bidirectional drive, and therefore further accomplish the effect described in the first embodiment. In addition, as described in the first embodiment, in the gate signal line drive circuit 104 according to this embodiment, each of the shift register basic circuits 113 may be provided with the transistor T14 that is the screen non-display period gate line high voltage applying circuit SWH, but it is not limited thereto. As described in the first embodiment, in the case of performing a drive in the corresponding drive method, the transistor T14 may be provided for at least one shift register basic circuit 113. In this case, since four gate signal lines 105 are connected to the input terminal of each shift register basic circuit 113, voltages of all of the gate signal lines 105 may be set to the high voltage in a manner relatively faster than the first embodiment. In addition, as described in the first embodiment, all of the plurality of the shift register basic circuits 113 may not be provided with the transistor T14.

Third Embodiment

A display device according to a third embodiment of the invention has basically the same configuration as the display device according to the first embodiment. A main difference from the display device according to the first embodiment is in a configuration of the shift register basic circuit 113.

Figure 7:
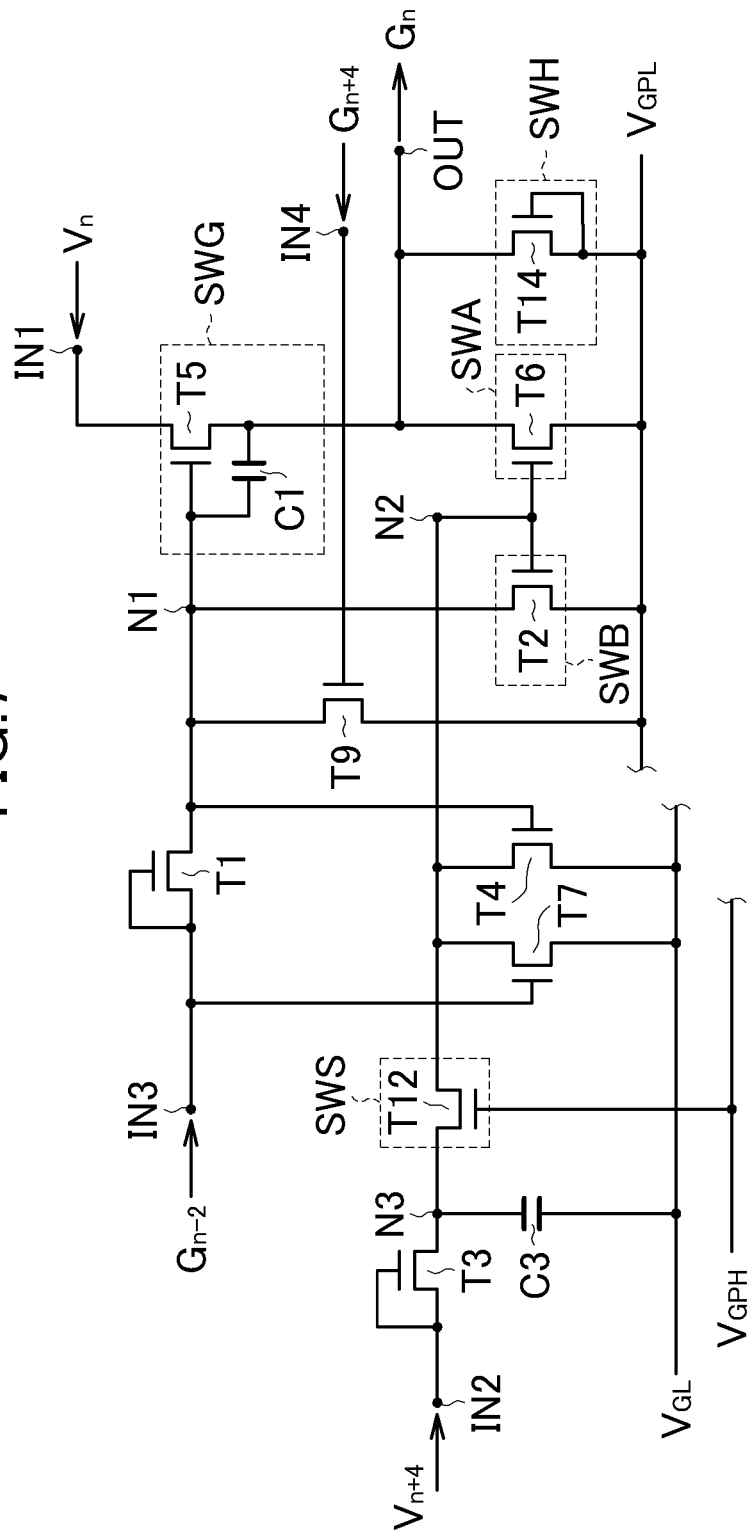
FIG. 7 is a circuit diagram of an $n^{th}$ shift register basic circuit of a shift register circuit according to a third embodiment of the invention.

FIG. 7 shows a circuit diagram of an $n^{th}$ shift register basic circuit 113-$n$ of a shift register circuit 112 according to this embodiment. In the $n^{th}$ shift register basic circuit 113-$n$ shown in FIG. 7, differently from the $n^{th}$ shift register basic circuit 113-$n$ according to the first embodiment shown in FIG. 4, the transistor T13 that is the screen non-display period switch off-voltage applying circuit SWC is not disposed, and the output sides of the transistors T4 and T7 are connected to the node N2. Furthermore, even at the time of the normal screen display and even for the predetermined period at the time of the screen non-display, input sides of the transistors T4 and T7 are connected to a low voltage line $V_{GL}$ that is set to the low voltage, and the holding capacitor C3 is disposed between the node N3 and the low voltage line $V_{GL}$.

The shift register basic circuit 113 according to this embodiment is driven according to the drive method shown in FIG. 5. Particularly, for the period $T_A$ at the time of the normal screen display, the shift register basic circuit 113 according to this embodiment is driven similarly to the shift register basic circuit 113 according to the first embodiment.

In regard to the period $T_B$ that is the predetermined period at the time of the screen non-display, as is the case with the first embodiment, at the beginning of the period $T_B$, the transistor T12 is turned off, and therefore the node N2 is electrically insulated from the node N3. In addition, as is the case with the first embodiment, the transistor T14 is turned on and applies the high voltage to the output terminal OUT, and therefore the voltage of the gate signal line 105 that is connected to the output terminal OUT varies from the low voltage to the high voltage.

In the shift register basic circuit 113 according to the first embodiment, the transistor T13 applies the low voltage of the variable high voltage line $V_{GPH}$ to the node N2. Contrary to this, in the shift register basic circuit 113 according to this embodiment, the gate signal line 105, which is connected to the input terminals IN3 and IN4, respectively, varies from the low voltage to the high voltage, and therefore the transistor T7 is turned on. In addition, the transistor T4 is turned on in response to a timing at which the node N1 varies from the low voltage to the high voltage, and the transistors T4 and T7 in on-state apply the low voltage of the low voltage line $V_{GL}$ to the node N2, and the node N2 varies from the high voltage to the low voltage. That is, in the shift register basic circuit 113 according to the first embodiment, the transistor T13 sets the node N2 to the low voltage for the predetermined period at the time of the screen non-display, but in the shift register basic circuit 113 according to this embodiment, the transistors T4 and T7, which make the node N2 vary to the low voltage at the time of the normal screen display, set the node N2 to the low voltage even in the predetermined period at the time of the screen non-display. In this manner, the shift register basic circuit 113 has a configuration in which an increase in circuit size is further suppressed.

Furthermore, in the gate signal line drive circuit 104, when each shift register basic circuit 113 is provided with the transistor T14, it is not necessarily to include the transistor T12 that is the screen non-display period off-control switching element SWS. When four clock signal lines are set to the low voltage for the predetermined period at the time of the screen non-display, the transistor T3 may be held at off-state, so that the transistor T12 may be omitted. In addition, in this case, it is necessary to devise that the node N1 and the gate of the transistor T5 are to be electrically insulated from each other, or the input terminal IN1 and the input side of the transistor T5 are to be electrically insulated from each other.

Fourth Embodiment

A display device according to a fourth embodiment of the invention has basically the same configuration as the display device according to the first embodiment. A main difference from the display device according to the first embodiment is in a configuration of the gate signal line drive circuit 104.

Figure 8:
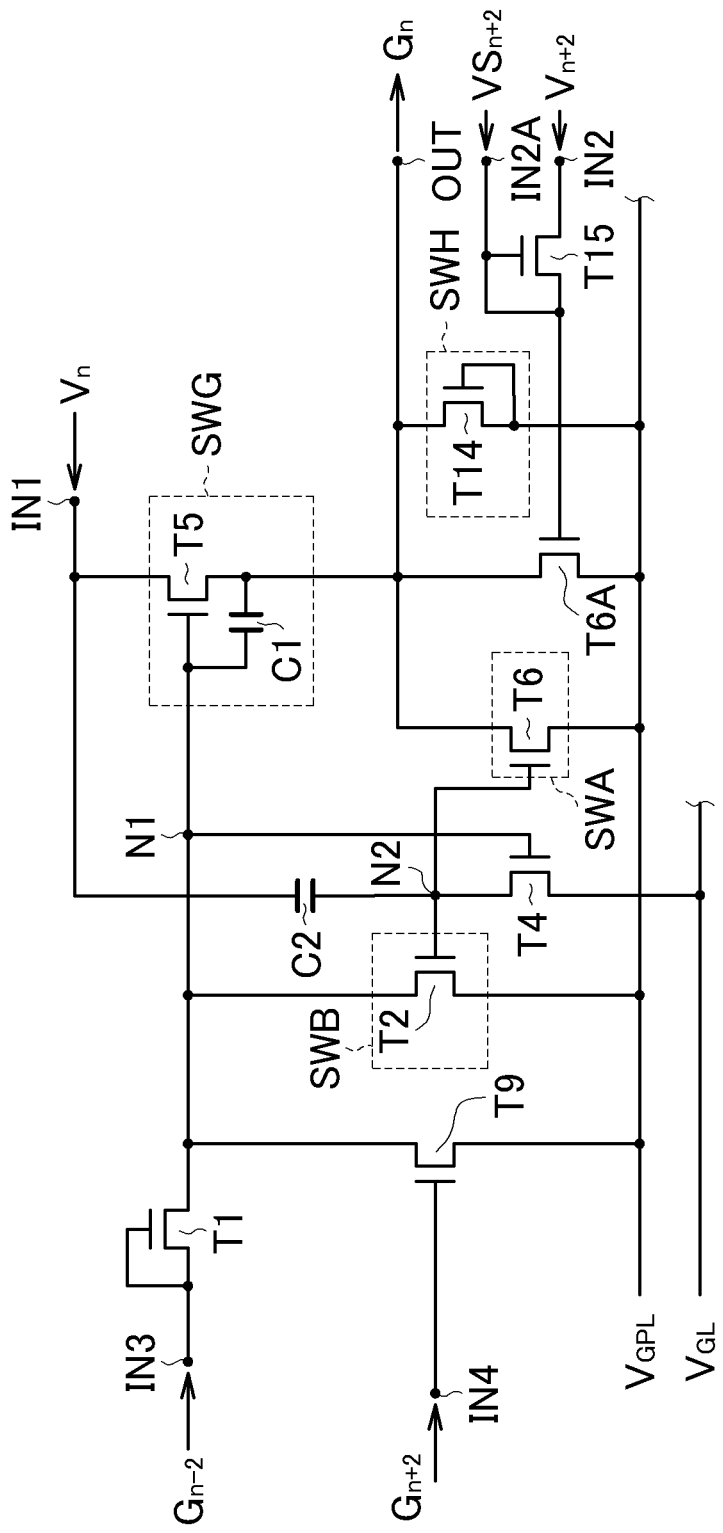
FIG. 8 is a circuit diagram of an $n^{th}$ shift register basic circuit of a shift register circuit according to a fourth embodiment of the invention.

FIG. 8 shows a circuit diagram of an $n^{th}$ shift register basic circuit 113-$n$ of a shift register circuit 112 according to this embodiment. Two clock signal lines and two auxiliary clock signal lines are connected to an odd-numbered shift register basic circuit 113 according to this embodiment. At the time of the normal screen display, the clock signals $V_n$ and $V_{n+2}$ of a predetermined cycle with two phases (opposite phases) different from each other are input to the two clock signal lines, and the high voltage is input thereto for the predetermined period at the time of the screen non-display. At the time of the normal screen display, auxiliary clock signals $VS_n$ and $VS_{n+2}$ which are the same as the clock signals $V_n$ and $V_{n+2}$ with two phases in voltage variation, respectively are input to the two auxiliary clock signal lines, and for the predetermined period at the time of the screen non-display, the low voltage is applied thereto. This is true of an even-numbered shift register basic circuit 113.

Similarly to the $n^{th}$ shift register basic circuit 113-$n$ according to the first embodiment shown in FIG. 4, the $n^{th}$ shift register basic circuit 113-$n$ according to this embodiment shown in FIG. 8 is provided with the transistors T1, T2, T4, T5, T6, T14, and the voltage-raising capacitor C1. In addition, a capacitor C2 and transistors T6A and T14 are further provided. The gate signal $G_{n+2}$ is input to the input terminal IN4, the clock signal $V_{n+2}$ is input to the input terminal IN2, and the auxiliary clock signal $VS_{n+2}$ is input to an input terminal IN2A.

Figure 9:
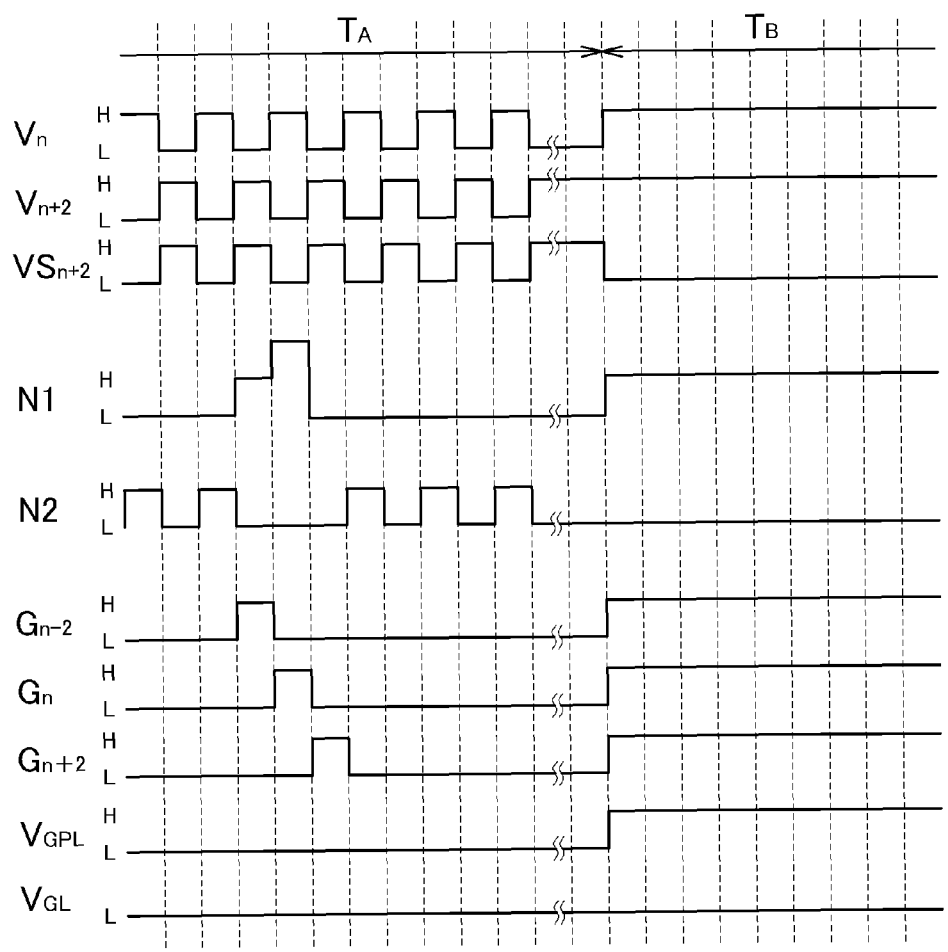
FIG. 9 is a diagram illustrating a drive method of the $n^{th}$ shift register basic circuit according to the fourth embodiment of the invention.

FIG. 9 is a diagram illustrating a drive method of the $n^{th}$ shift register basic circuit 113-$n$ according to this embodiment, and time changes of the nodes N1 and N2 are expressed together with voltages of two clock signal lines to which clock signals with two phases are input, respectively, and one auxiliary clock signal line, and voltages of the variable low voltage line $V_{GPL}$ and the low voltage line $V_{GL}$.

For a period $T_A$ at the time of the normal pixel display, the node N1 is held at the low voltage in response to the signal low period. The node N2 is set to the high voltage when $V_n$ is the high voltage. When the gate signal $G_{n-2}$ varies to the high voltage, the transistor T1 is turned on and applies the high voltage of the gate signal $G_{n-2}$ to the node N1, and thereby the node N1 varies from the low voltage to the high voltage.

When the gate signal $G_{n+2}$ varies to high voltage, the transistor T9 is turned on and applies the low voltage of the variable low voltage line $V_{GPL}$ to the node N1, and the node N1 varies from the high voltage to the low voltage.

In response to the timing at which the node N1 varies to the high voltage, the transistor T4 whose gate is connected to the node N1 is turned on and applies the low voltage of the low voltage line $V_{GL}$ to the node N2, and the node N2 varies from the high voltage to the low voltage. In addition, the transistor T4 enters on-state while the node N1 is set to the high voltage, and the node N2 is held at the low voltage. The clock signal $V_n$ is set to the high voltage for the signal high period in which the voltage of the gate signal $G_n$ becomes the high voltage. However, the capacitor C2 is disposed between the input terminal IN1 and the node N2, and the node N2 is held at the low voltage due to a capacitor coupling of the capacitor C2. When the node N1 is again set to low voltage and thereby the transistor T4 is turned off, the node N2 is set to the high voltage at a timing at which the clock signal $V_n$ is set to the high voltage. In response to the timing at which the node N2 varies to the high voltage, the transistor T2 is turned on, the transistor T2 in on-state applies the low voltage of the variable low voltage line $V_{GPL}$ to the node N1, and the node N1 is held at the low voltage.

The transistor T6A is disposed between the output terminal OUT and the variable low voltage line $V_{GPL}$ in parallel to the transistor T6. A gate and an output side of a transistor T15 are diode-connected to each other, and therefore the gate and the output side of the transistor T15 are connected to a gate of the transistor T6A. The input terminal IN2 is connected to an input side of the transistor T15, and the clock signal $V_{n+2}$ is input to the input terminal IN2. The input terminal IN2A is connected to the gate of the transistor T15, and the auxiliary clock signal $VS_{n+2}$ is input to the input terminal IN2A.

For the period $T_A$ at the time of the normal pixel display, since the same voltage variation occurs in the clock signal $V_{n+2}$ and the auxiliary clock signal $VS_{n+2}$, the gate and the input side of the transistor T15 are diode-connected to each other for the period $T_A$. When the clock signal $V_{n+2}$ is set to the high voltage, the transistor T6A is turned on, and the transistor T6A in on-state applies the low voltage of the variable low voltage line $V_{GPL}$ to the output terminal OUT. Contrary to this, when the clock signal $V_{n+2}$ is set to the low voltage, the transistor T6A enters off-state. Particularly, since the clock signal $V_{n+2}$ has a phase opposite to that of the clock signal $V_n$, when the clock signal $V_n$ is set to the high voltage for the signal high period, the clock signal $V_{n+2}$ is set to the low voltage, and therefore the transistor T6A enters off-state for the signal high period.

For the period $T_B$ that is a predetermined period at the time of the screen non-display, voltages of two clock signal lines to which the clock signals $V_n$ and $V_{n+2}$ with two phases are input, respectively, are set to the high voltage, and voltages of two auxiliary signal lines to which auxiliary clock signals $VS_n$ and $VS_{n+2}$ with two phases are input, respectively, are set to the low voltage. In addition, as described above, for the period $T_B$, the variable low voltage line $V_{GPL}$ is set to the high voltage, and the low voltage line $V_{GL}$ is held at the low voltage.

When the auxiliary clock signal lines are set to the low voltage, a voltage applied to the input terminal IN2 becomes the low voltage and the transistor T6A enters off-state. When the gate signal lines 105 that are connected to the input terminals IN3 and IN4 are set to the high voltage, the transistors T1 and T9 are turned on, and the transistor T1 applies the high voltage of the gate signal line 105 to the node N1, and the transistor T9 applies the high voltage of the variable low voltage line $V_{GPL}$ to the node N1, respectively. Therefore, the node N1 varies from the low voltage to the high voltage. In response to a timing when the node N1 varies to the high voltage, the transistor T4 is turned on, and the transistor T4 applies the low voltage of the low voltage line $V_{GL}$ to the node N2, and thereby the node N2 varies from the high voltage to the low voltage.

According to this configuration, for the period $T_B$ that is a predetermined period at the time of the screen non-display, the low voltage is applied to the gate of the transistor T6, and the high voltage is applied to the input side and the output side thereof. This is true of the transistor T2. In addition, the high voltage is applied to the plurality of gate signal lines 105 provided for the display device, and the high voltage is applied to gates of the plurality of TFT 109 that are connected to the gate signal lines 105, respectively. The shift register basic circuit 113 has a configuration in which an increase in circuit size is suppressed, but the effect described in the first embodiment is also accomplished in the display device according to this embodiment.

Hereinbefore, description has been made with respect to the gate signal line drive circuits 104 according to several embodiments of the invention and the display devices using the same. Here, in the gate signal line drive circuit 104 according to this embodiment, as shown in FIG. 3, a plurality of shift register basic circuits 113 are disposed at both sides of the display region 120, respectively. In this case, since the shift register basic circuits 113 that are provided for the gate signal line drive circuit 104 are disposed at both sides of the display region 120, a frame may be narrowed. However, for example, the shift register basic circuits 113 may be disposed at one side of the display region 120. In addition, here, the gate signal line drive circuit 104 according to this invention outputs a gate signal of an over-gate in which signal high periods of gate signals, which are applied to two gate signal lines 105 disposed in the display region 120 to be adjacent to each other, respectively, overlap each other by a semi-clock (one horizontal period (1H)). However, the gate signal line drive circuit 104 is not limited thereto, and for example, may output a gate signal of an over-gate in which a plurality of horizontal periods overlap each other. In addition, the gate signal line drive circuit 104 may output a normal gate signal in which the signal high periods of two gate signal lines that are disposed to be adjacent to each other are successive and do not overlap each other.

In addition, here, in regard to the shift register basic circuit 113 according to the invention, description has been made with respect to a case in which for a predetermined period at the time of the screen non-display, the transistor T6 that is the gate line low voltage applying circuit SWA and the transistor T2 that is the high voltage application off-control circuit SWB are turned off together. However, the invention is not limited thereto, and for example, the invention is also applicable to a case in which only the transistor T6 that is the gate line low voltage applying circuit SWA is turned off, or a case in which only the transistor T2 that is the high voltage application off-control circuit SWB is turned off.

Furthermore, here, each of the switching elements that make up the shift register basic circuit 113 according to the invention is formed of the NMOS transistor, but a PMOS transistor may be used according to necessity. In the case of the PMOS transistor, an on-voltage that is applied to the gate is set to a low voltage, and an off-voltage is set to a high voltage. Furthermore, a switching element other than the above-described switching elements may be used.

In addition, here, description has been made with respect to a case in which a control is performed by clock signals with four phases in the first to third embodiments, and a case in which the control is performed by clock signals with two phases in the fourth embodiment, but the control is not limited thereto.

Figure 10:
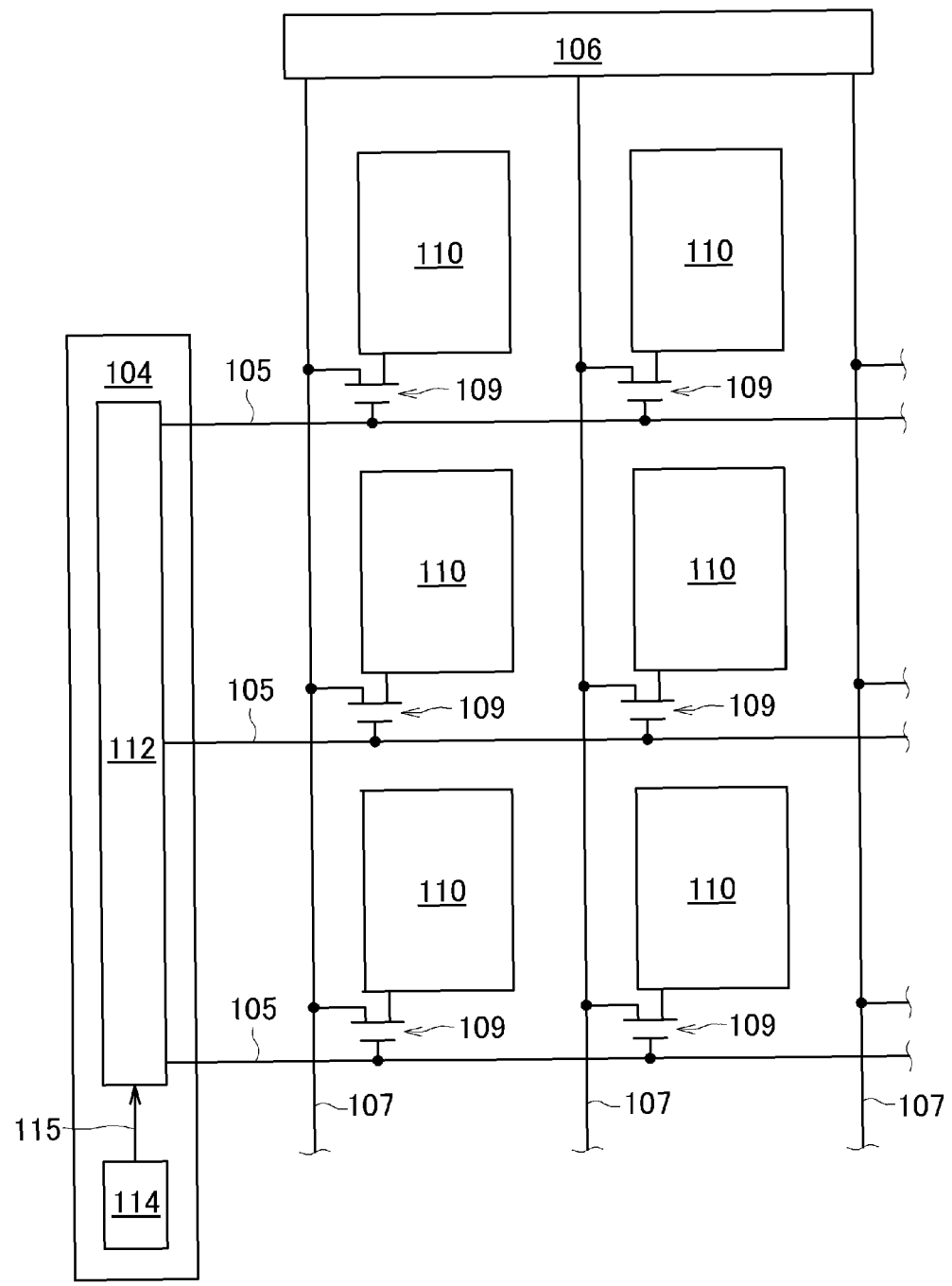
FIG. 10 is a conceptual diagram of an equivalent circuit of a TFT substrate provided for a liquid crystal display device according to another embodiment of the invention.
Figure 11:
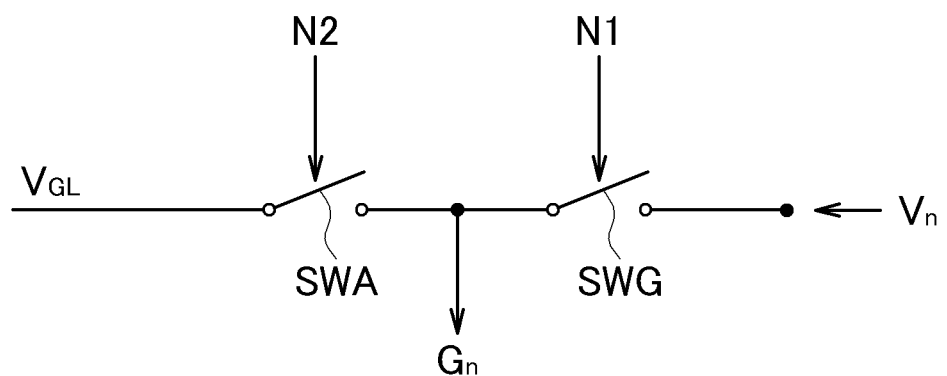
FIG. 11 is a simplified schematic diagram illustrating a configuration of a shift register basic circuit according to the related art.
Figure 12:
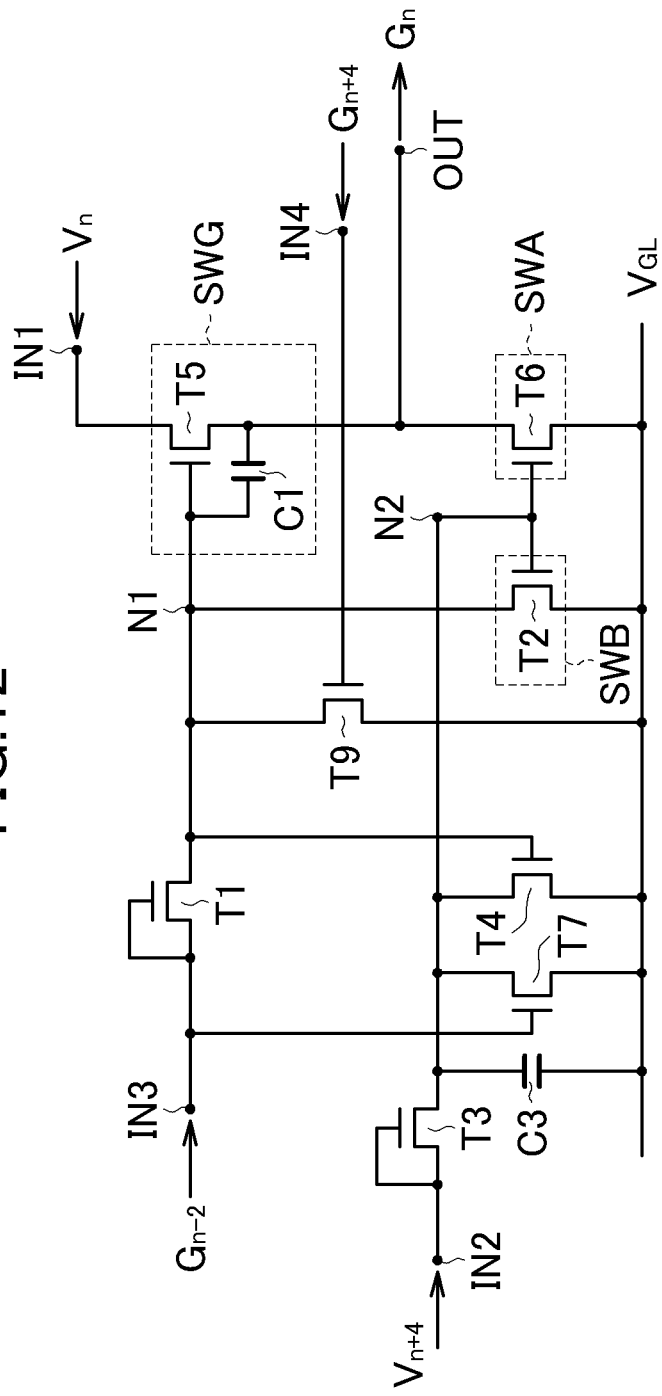
FIG. 12 is a circuit diagram of the shift register basic circuit according to the related art.

In addition, in regard to the display device according to this embodiments of the invention, description has been made with respect to an IPS-type liquid crystal display device as shown in FIG. 2, but the display device according to the invention may be a liquid crystal display device of other drive types such as a VA (Vertically Aligned) type and a TN (Twisted Nematic) type, and may be other display devices such as an organic EL display device. FIG. 10 shows a conceptual diagram of an equivalent circuit of the TFT substrate 102 provided for the VA type and TN type liquid crystal display devices. In the case of the VA type and the TN type, a common electrode 111 is provided for the filter substrate 101 that is opposite to the TFT substrate 102.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A gate signal line drive circuit, comprising:
a shift register basic circuit for applying a high voltage for a signal high period and a low voltage for a signal low period that is a period other than the signal high period, to a gate signal line at the time of a screen display, the shift register basic circuit comprising:
a gate line high voltage applying circuit, on an input side thereof being connected to a clock voltage line to which a clock signal of a predetermined cycle set to a high voltage for the signal high period at the time of a screen display is input, a switch thereof an on-voltage being applied to in response to the signal high period and an off-voltage being applied to in response to the signal low period, and applying a voltage of the clock signal line to the gate signal line in on-state; and
a gate line low voltage applying circuit, on an input side thereof being connected to a first reference voltage line set to a low voltage at the time of the screen display, a switch thereof an on-voltage being applied to in response to the signal low period and an off-voltage being applied to in response to the signal high period, and applying a voltage of the first reference voltage line to the gate signal line in on-state,
wherein in the shift register basic circuit, the off-voltage is applied to the switch of the gate line low voltage applying circuit for a predetermined period at the time of a screen non-display, and
wherein the shift register basic circuit further comprises a screen non-display period gate line high voltage applying circuit, entering on-state for the predetermined period at the time of the screen non-display and applying the high voltage to the gate signal line.

2. The gate signal line drive circuit according to claim 1, wherein the first reference voltage line is set to a high voltage for the predetermined period at the time of the screen non-display.

3. The gate signal line drive circuit according to claim 1, the shift register basic circuit further comprising:
a high voltage application off-control circuit, on an input side thereof being connected to a second reference voltage line set to an off-voltage at the time of the screen display, a switch thereof an on-voltage being applied to in response to the signal low period and an off-voltage being applied to in response to the signal high period to the switch, and applying a voltage of the second reference voltage line to the switch of the gate line high voltage applying circuit in on-state,
wherein in the shift register basic circuit, the off-voltage is applied to the switch of the high voltage application off-control circuit for the predetermined period at the time of the screen non-display.

4. The gate signal line drive circuit according to claim 3, wherein the second reference voltage line is set to an on-voltage for the predetermined period at the time of the screen non-display.

5. The gate signal line drive circuit according to claim 3, wherein the second reference voltage line is connected to the first reference voltage line, the off-voltage of the second reference voltage line is the same as the low voltage of the first reference voltage line, and the on-voltage of the second reference voltage line is the same as the high voltage of the first reference voltage line.

6. The gate signal line drive circuit according to claim 3, the shift register basic circuit further comprising:
a low voltage application on-control circuit comprising an on-application switching element, on an input side thereof being connected to another clock voltage line to which a clock signal of the predetermined cycle with a phase different from that of the clock signal at the time of the screen display is input, entering on-state when the clock signal of the different phase is at a high voltage, and applying a voltage of the clock signal of the different phase to the output side; and
a screen non-display period off-control switching element, being provided between an output side of the on-application switching element and both of the switch of the gate line low voltage applying circuit and the switch of the high voltage application off-control circuit, entering on-state at the time of the screen display and thereby being electrically connected, and entering off-state for the predetermined period at the time of the screen non-display and thereby being electrically insulated,
wherein the switch of the gate line low voltage applying circuit and the switch of the high voltage application off-control circuit are electrically connected to each other, and the on-voltage that is applied to the switch of the gate line low voltage applying circuit and the on-voltage that is applied to the switch of the high voltage application off-control circuit are the same as the high voltage of the clock signal with the different phase.

7. The gate signal line drive circuit according to claim 6, the shift register basic circuit further comprising:
a screen non-display period switch off-voltage applying circuit, entering on-state for the predetermined period at the time of the screen non-display and applying the off-voltage to the switch of the gate line low voltage applying circuit and the switch of the high voltage application off-control circuit.

8. The gate signal line drive circuit according to claim 7, wherein the other clock voltage line is held at a high voltage for the predetermined period at the time of the screen non-display.

9. The gate signal line drive circuit according to claim 3, further comprising:
another shift register basic circuit for applying to another gate signal line a high voltage for another signal high period at the time of the screen display, a low voltage for another signal low period that is a period other than the other signal high period at the time of the screen display, and a high voltage for the predetermined period at the time of the screen non-display, wherein the shift register basic circuit further comprises, a screen non-display period high voltage application on-control circuit, a switch thereof being connected to the other gate signal line, entering on-state when the high voltage is applied to the other gate signal line, and applying an on-voltage to the switch of the gate line high voltage applying circuit for the predetermined period at the time of the screen non-display.

10. The gate signal line drive circuit according to claim 9, wherein the clock voltage line is held at a high voltage for the predetermined period at the time of the screen non-display.

11. A display device, comprising:

the gate signal line driving circuit according to claim 10; and a pixel circuit, being connected to the gate signal line, wherein the pixel circuit comprises a pixel switching element, entering on-state by the high voltage of the gate signal line and supplying a voltage of a video signal line to an output side thereof, the video signal line being connected to an input side of the pixel switching element.

12. The display device according to claim 11, further comprising:

a light source on a side opposite to a display side of the pixel circuit, wherein the predetermined period at the time of the screen non-display is included in a period in which the light source is not turned on during activation.

13. The gate signal line drive circuit according to claim 1, the shift register basic circuit further comprising:

a low voltage application on-control circuit comprising an on-application switching element, on an input side thereof being connected to another clock voltage line to which a clock signal of the predetermined cycle with a phase different from that of the clock signal at the time of the screen display is input, entering on-state when the clock signal of the different phase is at a high voltage, and applying a voltage of the clock signal of the different phase to the output side; and a screen non-display period off-control switching element, being provided between an output side of the on-application switching element and the switch of the gate line low voltage applying circuit, entering on-state at the time of the screen display and thereby being electrically connected, and entering off-state for the predetermined period at the time of the screen non-display and thereby being electrically insulated, wherein the on-voltage, which is applied to the switch of the gate line low voltage applying circuit, is the same as the high voltage of the clock signal with the different phase.

14. The gate signal line drive circuit according to claim 13, the shift register basic circuit further comprising:

a screen non-display period switch off-voltage applying circuit, entering on-state for the predetermined period at the time of the screen non-display and applying the off-voltage to the switch of the gate line low voltage applying circuit.

15. The gate signal line drive circuit according to claim 14, wherein the other clock voltage line is held at a high voltage for the predetermined period at the time of the screen non-display.

16. A display device, comprising:

the gate signal line drive circuit according to claim 1.

17. The display device according to claim 16, further comprising a pixel circuit, being connected to the gate signal line, wherein the shift register basic circuit of the gate signal line drive circuit further comprises a screen non-display period gate line high voltage applying circuit, entering on-state for the predetermined period at the time of the screen non-display and applying the high voltage to the gate signal line; and wherein the pixel circuit comprises a pixel switching element, entering on-state by the high voltage of the gate signal line and supplying a voltage of a video signal line to an output side thereof, the video signal line being connected to an input side of the pixel switching element.

18. The display device according to claim 17, further comprising:

a light source on a side opposite to a display side of the pixel circuit, wherein the predetermined period at the time of the screen non-display is included in a period in which the light source is not turned on during activation.

\* \* \* \* \*